United States Patent
Joet

(10) Patent No.: US 11,337,016 B2
(45) Date of Patent: May 17, 2022

(54) MECHANICAL CONNECTION FOR A MEMS AND NEMS DEVICE FOR MEASURING A VARIATION IN PRESSURE, AND DEVICE COMPRISING SUCH A MECHANICAL CONNECTION

(71) Applicant: COMMISSARIAT A L'ENERGIE ATOMIQUE ET AUX ENERGIES ALTERNATIVES, Paris (FR)

(72) Inventor: Loïc Joet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/928,721

(22) Filed: Jul. 14, 2020

(65) Prior Publication Data
US 2021/0021944 A1      Jan. 21, 2021

(30) Foreign Application Priority Data
Jul. 18, 2019   (FR) ...................................... 1908128

(51) Int. Cl.
H04R 29/00      (2006.01)
H04R 17/02      (2006.01)
(Continued)

(52) U.S. Cl.
CPC ........... *H04R 29/004* (2013.01); *H04R 17/02* (2013.01); *H04R 19/04* (2013.01); *B81B 3/0051* (2013.01);
(Continued)

(58) Field of Classification Search
CPC ...... H04R 29/004; H04R 17/02; H04R 19/04; H04R 2201/003; G01L 9/0072;
(Continued)

(56) References Cited

U.S. PATENT DOCUMENTS 5,317,917 A *   6/1994   Dufour ................. G01L 9/0022
                                                             73/702
2005/0179100 A1   8/2005   Barzen et al.
(Continued)

FOREIGN PATENT DOCUMENTS

FR          2 977 319 A1    1/2013
FR          3 059 659 A1    6/2018
WO    WO-2018104656 A1 *    6/2018 ............. H04R 31/00

*Primary Examiner* — Matthew A Eason
*Assistant Examiner* — Kuassi A Ganmavo
(74) *Attorney, Agent, or Firm* — BakerHostetler

(57) ABSTRACT

A mechanical connection is provided for a microelectromechanical and/or nanoelectromechanical device for measuring a variation in pressure. The device includes a fixed component extending in a main plane, a mobile component to move or deform in an out-of-plane direction under effect of a variation in pressure, and a detector of movement or deformation having at least one mobile element. The mechanical connection includes: a lever arm; a first connection connecting the mobile component to a first end of the lever arm, the first connection transmitting out-of-plane movement of the mobile component to the first end of the lever arm while allowing out-of-plane rotation of the lever arm about a direction of rotation; a second connection connected to the second end of the lever arm to allow mainly an out-of-plane rotation of the lever arm about an axis of rotation extending in the direction of rotation; a third connection connecting the lever arm to the detector at a given distance from the axis of rotation in the out-of-plane direction, the third connection being designed to convert the rotation of the lever arm about the axis of rotation into a translation in the plane of the at least one mobile element in a direction of translation.

19 Claims, 10 Drawing Sheets

(51) Int. Cl.
| | |
|---|---|
| *H04R 19/04* | (2006.01) |
| *H01L 41/08* | (2006.01) |
| *H01H 1/00* | (2006.01) |
| *G05G 11/00* | (2006.01) |
| *G01L 9/00* | (2006.01) |
| *B81B 3/00* | (2006.01) |
| *F16C 11/04* | (2006.01) |

(52) U.S. Cl.
CPC ... *B81B 2201/032* (2013.01); *B81B 2201/037* (2013.01); *B81B 2203/051* (2013.01); *F16C 11/04* (2013.01); *G01L 9/001* (2013.01); *G01L 9/0072* (2013.01); *G05G 11/00* (2013.01); *H01H 1/0036* (2013.01); *H01H 2001/0078* (2013.01); *H01L 41/08* (2013.01); *H04R 2201/003* (2013.01)

(58) Field of Classification Search
CPC ....... G01L 9/001; G01L 9/009; H01H 1/0036; H01H 2001/0078; H01L 41/08; B81B 3/0051; B81B 2201/032; B81B 2203/051; B81B 2201/037; G05G 11/00; F16C 11/04

See application file for complete search history.

(56) References Cited

U.S. PATENT DOCUMENTS

| | | | |
|---|---|---|---|
| 2006/0077594 A1* | 4/2006 | White et al. | G11B 5/5552 |
| 2008/0239446 A1* | 10/2008 | Jung | G02B 26/0841 |
| | | | 359/225.1 |
| 2012/0017693 A1* | 1/2012 | Robert | H04R 11/04 |
| | | | 73/753 |
| 2014/0060169 A1* | 3/2014 | McNeil | B60C 23/0408 |
| | | | 73/718 |
| 2016/0277847 A1* | 9/2016 | Joet | H04R 17/02 |
| 2017/0088016 A1* | 3/2017 | Frye | B60N 2/0244 |
| 2019/0004084 A1* | 1/2019 | Landgraf | B81B 3/0086 |
| 2020/0088598 A1* | 3/2020 | Zehringer | G01L 9/0072 |

* cited by examiner

MECHANICAL CONNECTION FOR A MEMS AND NEMS DEVICE FOR MEASURING A VARIATION IN PRESSURE, AND DEVICE COMPRISING SUCH A MECHANICAL CONNECTION

CROSS-REFERENCE TO RELATED APPLICATIONS

This application claims priority to foreign French patent application No. FR 1908128, filed on Jul. 18, 2019, the disclosure of which is incorporated by reference in its entirety.

FIELD OF THE INVENTION

The present invention falls within the field of microphones and more generally of devices for measuring a variation in pressure using "MEMS" (MicroElectroMechanical Systems) and/or "NEMS" (NanoElectroMechanical Systems) technology. Devices employing these two technologies will be referred to throughout the description as "MEMS-NEMS devices".

More specifically, the invention relates to a mechanical connection for a MEMS-NEMS device for measuring the variation in pressure which employs the detection of motion (movement or deformation) of a mobile component such as a diaphragm or a piston with respect to a fixed component such as a substrate, the motion being transmitted to a motion detector, notably a capacitive detector, which allows same to be measured.

A MEMS-NEMS device for measuring a variation in pressure may be a microphone, an absolute-pressure or a differential-pressure sensor.

BACKGROUND

MEMS and/or NEMS microphones are a market in the throes of expansion, notably thanks to the market for mobile devices, such as tablets, mobile telephones of the smartphone type and other connected objects, in which they are gradually replacing electret microphones.

Microphones measure a variation in pressure and therefore comprise at least one part in contact with the outside.

Most of the MEMS microphones currently being produced are capacitive detection microphones, an exemplary embodiment of which is described in the document US20050179100.

One known capacitive detection microphone comprises a flexible diaphragm separating the outside from an at least partially closed chamber referred to as the back volume, which serves as a pressure reference. The diaphragm deforms under the effect of the pressure differential across its two surfaces. The diaphragm forms one electrode. A fixed and rigid backplate electrode is positioned facing the diaphragm. The diaphragm and the backplate electrode form a capacitor the capacitance of which varies according to the deformation of the diaphragm under the effect of the pressure differential across its two surfaces. Holes in the diaphragm, known as ventilation holes, allow the pressures between the outside and the back volume of the microphone to equalize. This in particular allows low frequency phenomena (for example due to the altitude, to a depression, etc.), which may be far more significant than the sound that is to be measured, to be filtered out without attenuating signals higher than a few tens or hundreds of Hertz. The backplate electrode is also pierced with holes and allows the air through so that the pressure can become established on the surface of the diaphragm.

This structure offers a certain number of advantages, although it does have disadvantages notably on account of the presence of the backplate electrode. Specifically, this electrode lies in the acoustic path. Although holed, it does offer acoustic resistance, i.e. offers resistance to the passage of the air and therefore to the establishing of the pressure. Thus, when the holes are too small and/or too widely spaced, the acoustic resistance results in a noise (induced by the backplate electrode) which impairs the quality of the signal before any transduction. In order to limit this resistance, the density and size of the holes may be increased, but this has the direct consequence of reducing the mutually-facing areas, which proportionately reduces the capacitive detection. Thus, the electrical signal is weaker and the electronic noise (notably that induced by the signal processing) is less well masked. In both instances, that leads to an impairment in the detection threshold. For a fixed size of diaphragm, it is necessary to find a design that allows the overall impairment of the detection threshold to be minimized.

Because the backplate electrode is the main cause of performance losses, one solution is to reduce its impact or even to eliminate it.

There are piezoelectric detection MEMS microphones that are notably able to eliminate the disadvantages resulting from the backplate electrode. For example, the diaphragm comprises a piezoelectric material. As it deforms, charges are created at the surface of the piezoelectric material and these are collected by electrodes encapsulating this material. The electrical signal, i.e. the number of charges created, is representative of the deformation of the diaphragm. However, in the case of piezoelectric detection, the number of charges is given by the mechanical stresses within the material, it cannot be increased by a polarizing voltage or any other external artefact. If a greater number of charges are to be obtained, then the size of the diaphragm needs to be increased in order to collect more energy, so as to stress the piezoelectric material to a greater extent.

Now, as with capacitive detection, it is desirable to avoid increasing the surface area of the diaphragm. This is because, aside from the fact that this has the effect of increasing the size of the structure and therefore the cost thereof, a diaphragm with a larger surface area will displace more air as it deforms. This volume of displaced air creates a variation in pressure in the back cavity, therefore requiring a force opposing the motion on the diaphragm. This force is proportional to the ratio of the square of the surface area of the diaphragm to the back volume. This force acts on the diaphragm like an additional spring, a spring that will oppose the movement. The increase in the surface area of the diaphragm will therefore need to be accompanied by an increase in the size of the back volume, and therefore of the housing, if an equivalent diaphragm movement is to be maintained.

Therefore, a piezoelectric detection microphone offers a limited improvement compared with capacitive detection.

Other solutions involve removing the backplate electrode from the acoustic pathway. Thus, a first solution is to separate mechanical transduction (the diaphragm) from electrical transduction (electrodes) by offsetting the latter, the backplate electrode then finding itself off the acoustic pathway. A second solution, which may complement the first, consists in performing the electrical transduction under vacuum, like in the MEMS-NEMS microphone described in patent application FR3059659. Because electrical transduction is performed under vacuum, it no longer causes any acoustic noise.

This second solution is illustrated in FIGS. 1A (view from above), 1B (view from beneath) and a variant is illustrated in FIG. 2.

The device depicted comprises a housing 2, a measurement diaphragm 4 in contact with the external environment (generally the air) a variation in the pressure of which is to be measured, a measurement chamber 6 isolated from the external environment (and able to be placed under vacuum) and a mechanical transmission element 20 (formed by the elements 20.1, 20.2 and 20.3 in FIGS. 1A and 1B, as explained later on) between the external environment and the measurement chamber 6. The measurement diaphragm 4 is made of a thin layer (NEMS), for example of the order of 1 µm. The housing 2 comprises a top plate 12 which comprises a first opening 14 which is partially closed by the measurement diaphragm 4 and a second opening 18 opening onto the measurement chamber 6 and partially closed off by a sealing membrane 16. The transmission element 20 comprises a first transmission arm 20.1 arranged in the external environment, a second transmission arm 20.2 arranged in the measurement chamber 6 and a transmission shaft 20.3 (hinge) rigidly connecting the two arms while at the same time ensuring that the measurement chamber is fluidtight. The transmission element 20 extends at rest in the direction X. It is articulated in rotation by a pivot articulation 22 on the housing 2. The pivot articulation 22 comprises two blades 22.1 and 22.2 connected to the housing 2 and to the hinge 20.3 and having a small dimension in the direction X so as to be deformable in torsion about the direction Y and thus define with the sealing membrane 16 the axis of rotation of the pivot articulation 22. The transmission element 20 is rigid or largely nondeformable. The free end of the first transmission arm 20.1 is connected to the diaphragm 4 by an articulation 23 (formed by at least one torsion blade) transmitting the movement in the direction Z while at the same time allowing rotation about the axis Y and translation along the axis X, for example two blades parallel to the axis Y and deformable in torsion. The free end of the second transmission arm 20.2 is connected to a mobile electrode 21 which forms part of the capacitive measurement means. The mobile electrode 21 is positioned in the evacuated measurement chamber. In this configuration, the motion of the second transmission arm 20.2 connected to the mobile electrode is out-of-plane. The capacitive measurement is obtained from the motion of the mobile electrode 21, moving out-of-plane, and causing a variation in the airgap to at least one fixed electrode 17 positioned facing it so as to allow capacitive detection.

FIG. 1B (viewed from beneath) illustrates the case in which the capacitive measurement means (capacitive transduction means) comprise a first fixed electrode 17, a second fixed electrode 19 some distance from the first fixed electrode 17 and a mobile electrode 21 fixed to the free end of the second transmission arm 20.2, which thus moves with the transmission arm. The mobile electrode 21 is positioned between the first fixed electrode 17 and the second fixed electrode 19 parallel to these and able to move closer to one or to the other. Such measurement means allow differential measurement. By measuring the variation in airgap between the mobile electrode 21 and the first fixed electrode 17 and between the mobile electrode 21 and the second fixed electrode 19 it is possible to detect the movement of the transmission element 20 which is induced by the movement of the measurement diaphragm 4 and thus determine the variation in pressure. A fixed electrode may be referred to as a backplate electrode.

According to a variant, the diaphragm may be replaced by a piston 4' which may be outlined with and/or stiffened by one or more reinforcers, for example reinforcing beams (or stiffening beams), as illustrated in FIG. 2.

The second transmission arm 20.2 may be referred to as a "lever arm".

A first problem associated with this configuration is the deformation of the mobile electrode under the effect of the electrostatic forces, which limits the length of the lever arm. This problem is amplified when the substrate is not conducting and only a single backplate electrode is used, because the electrostatic forces in this case cannot balance each other out locally (they can be balanced out by creating a Roberval balance, but they cannot be cancelled out locally). In order to reduce these deformations, one solution is to increase the thickness of the MEMS layer in order to increase the out-of-plane bending stiffness of the lever arm and/or add stiffening beams to the mobile electrode. However, the thickness of the MEMS layer is limited to 10-30 µm by epitaxy and exceeding that would render the method overly expensive. Furthermore, if the thickness were increased, the deep etching would require wide trenches in order to conform to a reasonable width/depth aspect ratio, and this could lead to excessive losses around the diaphragm or the piston.

A second problem stems from the thickness of the thin layer (NEMS) of the diaphragm or of the piston. The desired thickness is of the order of 1 µm so that the diaphragm or the piston provides fluidtightness while at the same time remaining flexible. However, the thin layer that also forms the mobile electrode deforms under the effect of the electrostatic forces and stiffening the mobile electrode with the thick layer is necessary to avoid this deformation. As indicated hereinabove, stiffening is generally achieved by a network of stiffening beams arranged uniformly over the total surface of the mobile electrode. Furthermore, in order to polarize each of the backplate electrodes delimited by this network, it is necessary to create polarization blocks, and this takes a not-insignificant amount of space. The stiffening beams and the polarization blocks leave little space for the mobile electrode. If the number of stiffening beams and therefore the number of backplate electrode blocks is reduced, the first problem of the deformation of the mobile electrode under the effect of the electrostatic forces is again encountered.

A third problem stems from the fact that the capacitive detection airgap is defined and therefore limited by the thicknesses of the two sacrificial (oxide) layers which allow the mobile electrode to be freed from the backplate electrode (or backplate electrodes). As with the previous problems, the fact that these thicknesses are the same over the entire structure dictates compromises. In terms of the stresses associated with the mobile electrode, what is desired are airgaps of the order of 1 µm which allow a high density with good linearity. As far as the stresses associated with the diaphragm (or with the piston) are concerned, what is sought is an airgap that is as large as possible in order to limit the effects of the squeezing of the layer of air between the edges of the diaphragm (or of the piston) and the edges of the first opening above which it lies. This same thickness has a knock-on effect on the entire structure, and notably on the outside of the measurement chamber (on the air side). In particular, all around the diaphragm or all around the piston, over ten microns or so, the diaphragm or the piston protrudes beyond the first opening 14. When the diaphragm (or the piston) moves, it squeezes the film of air between it and the fixed part in the region of this overhang, creating a damping effect. In order to limit this damping effect, it would be necessary for the thickness of the diaphragm or of the piston to be as great as possible. However, it is known that the desired thickness is of the order of 1 µm so that the diaphragm or the piston provides sealing while at the same time remaining flexible.

In conclusion, this configuration entails limiting the length of the lever arm and therefore limiting the amplification of the motion of the diaphragm or of the piston in order to avoid inducing a risk of deformation of the mobile electrode and/or of the lever arm. Now, limiting the length of the lever arm also limits the size of the capacitive detection in the direction of the arm, especially when the capacitive density may have already been reduced if stiffening beams and polarizing blocks are added. Furthermore, this configuration imposes limits on the airgap and therefore on the capacitive density.

SUMMARY OF THE INVENTION

The invention seeks to overcome the aforementioned disadvantages of the prior art.

In particular it seeks to provide a MEMS and/or NEMS device for measuring a variation in pressure, for example a capacitive detection MEMS and/or NEMS microphone, which makes it possible to avoid the disadvantages due to the presence of a backplate electrode, while at the same time avoiding deformation of the mobile electrode (or of the mobile electrodes) and of the structure of the device, and to do so while not reducing the capacitive detection capacity, or even while at the same time increasing the capacitive detection capacity.

More broadly, the invention seeks to provide a MEMS-NEMS structure designed for a device for measuring a variation in pressure comprising a mobile component deforming or moving under the effect of a variation pressure, the deformation or the movement being measured by detection means, and which overcomes the drawbacks mentioned.

One solution allowing these disadvantages to be overcome relates to a mechanical connection and a device for measuring a variation in pressure comprising at least one such mechanical connection.

One first subject of the invention relates to a mechanical connection for a microelectromechanical and/or nanoelectromechanical device for measuring a variation in pressure, the device comprising a fixed component extending in a main plane, a mobile component able to move or to deform in an out-of-plane direction under the effect of a variation in pressure, and detection means for detecting the movement or the deformation comprising at least one mobile element, the mechanical connection comprising:

a lever arm;

a first connection connecting the mobile component to a first end of the lever arm, the first connection being designed to transmit the out-of-plane movement of the mobile component to the first end of the lever arm while allowing the out-of-plane rotation of the lever arm about a direction of rotation;

a second connection connected to the second end of the lever arm and configured to allow mainly an out-of-plane rotation of the lever arm about an axis of rotation extending in the direction of rotation;

a third connection connecting the lever arm to the detection means at a given distance from the axis of rotation in the out-of-plane direction, the third connection being designed to allow a rotation about an axis of bending which follows the same direction as the axis of rotation but which is offset by the given distance in the out-of-plane direction from the axis of rotation, so as to convert the rotation of the lever arm about the axis of rotation into a translation in the plane of the at least one mobile element in a direction of translation.

According to the invention, the "main plane" refers to the plane of reference of the microelectromechanical and/or nanoelectromechanical device, generally denoted by OXY. For the sake of simplicity, the term "plane" refers to the main plane. Planes other than the main plane will be referred to differently. The term "out-of-plane" is with reference to the main plane.

The terms "thickness", "thick", "thinness", "thin" are given in respect of dimensions perpendicular to the plane of the substrate.

The terms "slender", "slenderness", "wide", "width", "elongate", "elongation", "length", "long" are given in respect of dimensions in the plane of the substrate (or in a plane parallel to the plane of the substrate). In the present description, the length refers to the dimension in the direction X and the width refers to the dimension in the direction Y.

The terms "mobile" and "fixed" refer to the relative motion of one component or one part with respect to the other. The motion may be a movement or a deformation. Thus, according to the invention, the term "mobile" defines a component capable of moving or of deforming.

According to one embodiment, the detection means comprise a transmission component connected to the at least one mobile element of the detection means, the third connection being connected to the transmission component in such a way as to transmit the translation in the direction of translation to the mobile element via the transmission component.

According to one advantageous embodiment, the mechanical connection further comprises a fourth connection of the sliding-connection type, connected to the at least one mobile element or to the transmission component and configured to guide the mobile element or the transmission component in translation in the direction of translation.

According to one particular embodiment, the fourth connection comprises at least a simple thick bending blade bending in the main plane, the blade being slender in the direction of translation.

According to another particular embodiment, the fourth connection comprises at least a double thick bending blade bending in the main plane, each blade being slender in the direction of translation.

According to one embodiment, the first connection comprises at least one thick torsion blade twisting out-of-plane about a torsion axis parallel to the direction of rotation.

According to one embodiment, the second connection comprises at least a first blade which is a thick torsion blade twisting out-of-plane about the direction of rotation and/or at least a second blade which is a bending blade bending out-of-plane about the direction of rotation, each of the first and/or second blades being connected on the one hand to the lever arm and on the other hand to the fixed component, for example using at least one anchoring block. The second blade may be a thin blade or a thick blade.

According to one embodiment, the third connection comprises a bending blade bending out-of-plane about a bending axis, the blade extending in the direction of translation and being either a thick blade or a thin blade, the bending axis being parallel to the axis of rotation and offset by the given distance with respect to the axis of rotation in the out-of-plane direction.

A second subject of the invention relates to a device for measuring a variation in pressure comprising a fixed component extending in the main plane, a mobile component moving or deforming out-of-plane under the effect of a variation in pressure, and detection means for detecting the movement or the deformation and a mechanical connection according to the first subject of the invention, the mechanical connection being configured to connect the mobile component to at least one mobile element of the detection means.

According to one embodiment, the mobile component is a flexible or semi-rigid diaphragm.

According to an alternative embodiment, the mobile component is a rigid piston.

According to one particular embodiment, the device for measuring a variation in pressure comprises a reduced-pressure measurement chamber, a sealing membrane at least partially closing the measurement chamber and means of fluidtight connection between the inside and the outside of the measurement chamber, the first connection being positioned on the outside of the measurement chamber, the second connection being connected to the fluidtight-connection means, the detection means and the third connection being positioned in the measurement chamber.

According to one embodiment, the detection means comprise a mobile electrode connected to the third connection or to the transmission component and at least one fixed electrode, the electrodes extending in the main plane and the airgap between the mobile electrode and the at least one fixed electrode being defined by a dimension of the electrodes in the main plane and by the thickness of the electrodes, the translational motion transmitted by the third connection to the mobile electrode being able to cause the airgap between the mobile electrode and the at least one fixed electrode to vary in the direction of translation. That allows the creation of capacitive transduction with a variation in airgap.

According to one particular embodiment, the electrodes comprise several fingers, the fingers of the mobile electrode being interdigitated with the fingers of the at least one fixed electrode and the fingers of the electrodes extend perpendicular to the direction of the translation transmitted to the mobile electrode.

According to one alternative embodiment, the detection means comprise a mobile electrode connected to the third connection or to the transmission component and at least one fixed electrode, the electrodes extending in the main plane and the mutually-facing surface areas of the mobile electrode and of the at least one fixed electrode being defined by a dimension of the electrodes in the main plane and by the thickness of the electrodes, the translational motion transmitted by the third connection to the mobile electrode being able to cause the mutually-facing surface areas of the mobile electrode and of the at least one fixed electrode to vary in the direction of translation. That allows the creation of capacitive transduction with a variation of surface area.

According to one particular embodiment, the electrodes comprise several fingers, the fingers of the mobile electrode being interdigitated with the fingers of the at least one fixed electrode and the fingers of the electrodes extend in the direction of the translation transmitted to the mobile electrode.

According to one particular embodiment, the detection means comprise two fixed electrodes so as to perform differential detection.

According to another alternative embodiment, the detection means comprise a resonant beam, excitation means lateral to the beam and means for measuring the deformation of the beam in the lateral direction, for example piezoresistive gauges on either side of the resonant beam.

According to one particular embodiment, the device for measuring a variation in pressure comprises at least two mechanical connections according to the first subject of the invention.

BRIEF DESCRIPTION OF THE DRAWINGS

Further features and advantages of the invention will become apparent from the following description, given by way of nonlimiting illustration and with reference to the attached figures, in which.

DETAILED DESCRIPTION

Throughout the present detailed description, the main plane (or "plane") is designated by the reference OXY and generally corresponds to the plane of the substrate on which the MEMS-NEMS structure is manufactured. The out-of-plane direction is represented by the direction Z. The direction of translation in the main plane is represented by the direction X. The direction of out-of-plane rotation is represented by the direction Y.

Throughout the present detailed description, elements that perform the same functions and are produced in structurally similar ways are generally denoted by the same reference. Elements that perform the same functions but are produced in structurally different ways are generally denoted by different references.

Figure 1A:
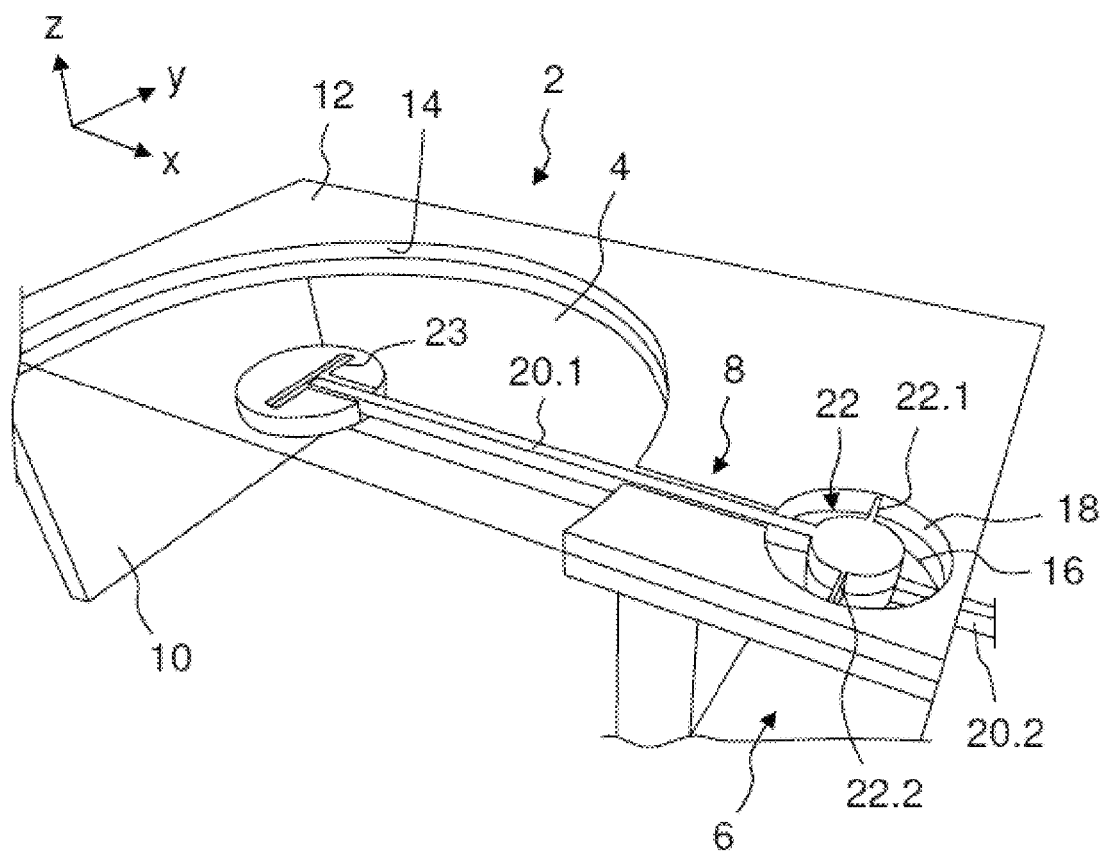
FIGS. 1A-1B depict a microphone of the prior art.
Figure 1B:
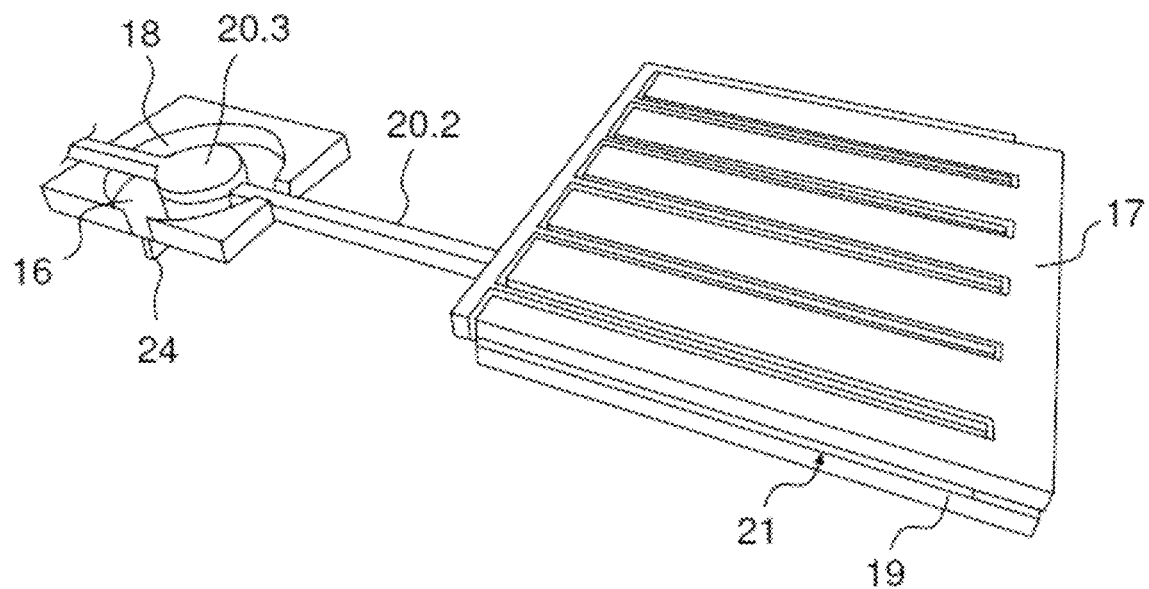
Figure 2:
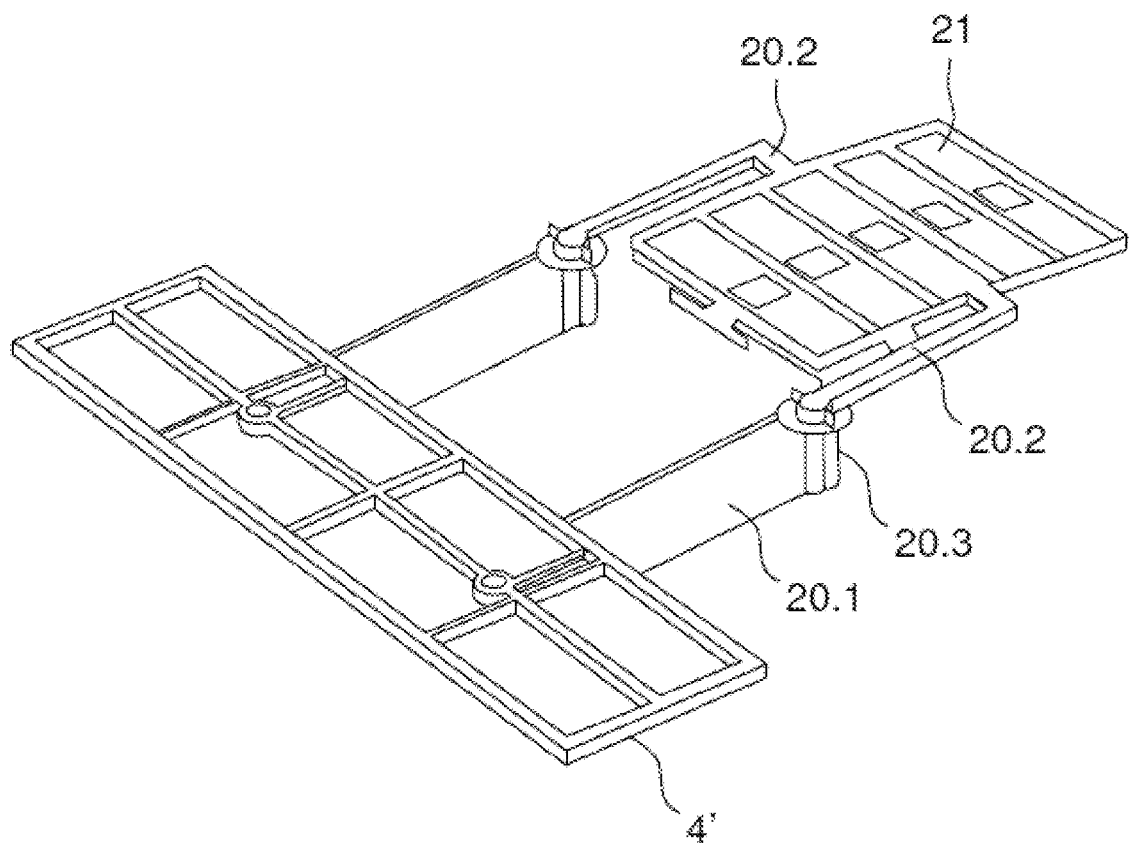
FIG. 2 depicts a variant of a microphone of the prior art.

FIGS. 1A, 1B and 2 were described hereinabove and will not be covered again here.

The invention consists in converting an out-of-plane motion (deformation or movement) of a mobile component (diaphragm, piston for example) into a translational motion in a plane. The translational motion obtained is transmitted to detection means in order to be measured and in order therefore to deduce motion of the mobile component (for example the deformation of the diaphragm, the movement of the piston, etc.). For example, the translational motion may be transmitted to a mobile electrode able to move in such a way as to move it in translation in a plane relative to a fixed electrode, thereby forming a capacitive detection means.

Throughout the detailed description, the plane refers to the plane of the support of the measurement device, for example of the substrate, or a plane parallel to the plane of the support.

Figure 3A:
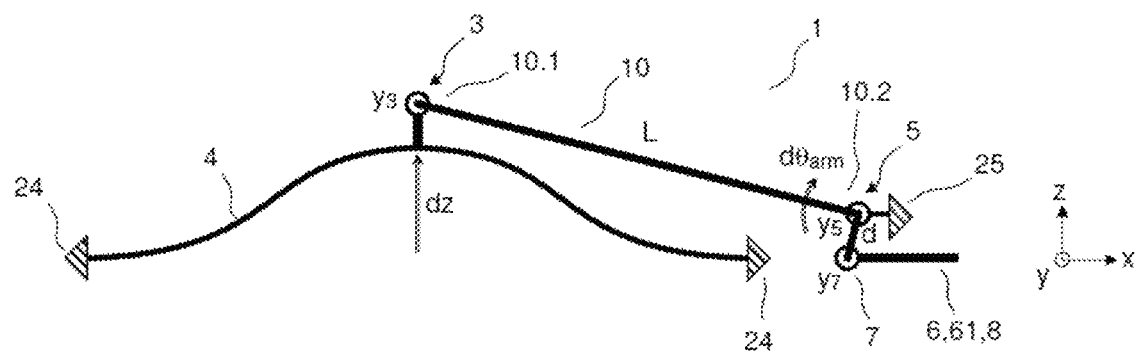
FIGS. 3A-3B schematically depict two variants of mechanical connections according to the invention.
Figure 3B:
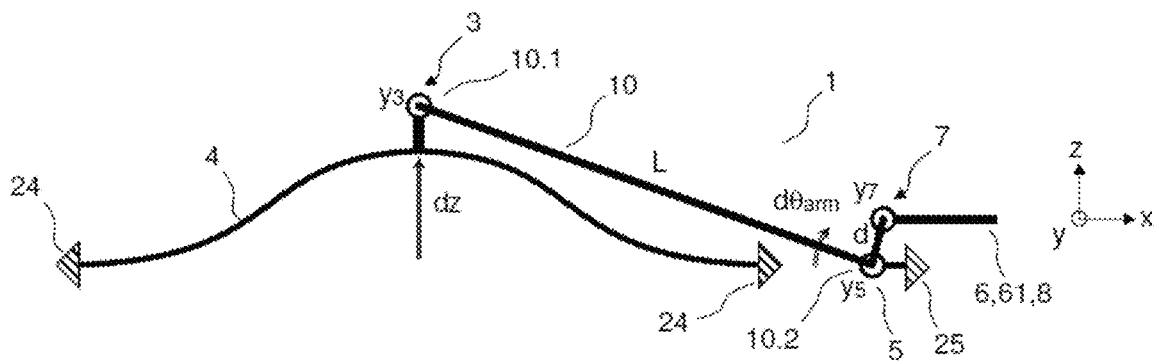

FIGS. 3A and 3B schematically depict two variants of mechanical connections according to the invention in the case of a diaphragm 4 which deforms in the out-of-plane direction Z under the effect of a difference in pressure across its two faces, the mechanical connection connecting the diaphragm to detection means and allowing the out-of-plane deformation of the diaphragm to be converted into a translational motion in the plane OXY in the direction of translation X. The ends of the diaphragm 4 are anchored to the fixed component, for example to a substrate (not depicted in FIGS. 3A and 3B) by an anchor means 24.

In the two variants depicted, the mechanical connection 1 connects the diaphragm 4 to a mobile electrode 61 which, with at least one fixed electrode (not depicted in these figures), forms part of a capacitive detection unit 6. The mechanical connection 1 comprises:

a lever arm 10 of length L;

a first connection 3 connecting the diaphragm 4 at its centre to a first end 10.1 of the lever arm 10;

a second connection 5 (or pivot connection) connected to the second end 10.2 of the lever arm 10 and fixed to the substrate (not depicted) by an anchor means 25;

a third connection 7 (or coupling connection) which connects the lever arm 10 to the mobile electrode 61 with an offset by a distance d in the out-of-plane direction Z.

The first connection 3 allows the transmission of out-of-plane motion of the diaphragm 4 to the first end 10.1 of the lever arm 10. The first connection may be formed by a blade that is rigid in the out-of-plane direction Z to transmit to the lever arm a translation in the out-of-plane direction. This may be a thick blade, wide in a direction Y and slender in the direction X so as to allow twisting about a torsion axis Y3 extending in the direction of rotation Y.

The second connection 5 allows the out-of-plane translation transmitted to the first end 10.1 of the lever arm 10 to be followed by the first connection 3, while at the same time imposing a rotation on the lever arm about an axis of rotation Y5 formed at the second end 10.2 of the lever arm and extending in the direction Y.

The second connection may be obtained by at least one blade that is thick to block translation in the direction Z and flexible in torsion about the direction Y, associated with at least one blade that is long in the direction X to block translation along X and flexible in bending about the direction Y. This second connection may be referred to as a "pivot connection".

Thus, when the diaphragm deforms (variation dz) under the effect of a difference in pressure across its two faces, it brings about an out-of-plane translational motion of the first end 10.1 of the lever arm 10 by the first connection 3, which lever arm is held in out-of-plane rotation at its second end 10.2 by the second connection 5. Because the first connection 3 is rigid in the out-of-plane of direction Z, it transmits the out-of-plane movement of the diaphragm to the first end 10.1 of the lever arm 10. Furthermore, it allows the lever arm 10 to rotate about its axis of rotation Y5 and to bend in the direction X as a result of its flexibility (slenderness) in the direction X, which means that the translation of the diaphragm 4, purely in Z, is allowed to coexist with the movement of the first end 10.1 of the lever arm, in an arc of a circle, as a result of the rotation of the lever arm.

The third connection 7 connects the second end 10.2 of the lever arm 10 to the mobile electrode 61. This third connection 7 allows a rotation about a bending axis Y7 which follows the same direction Y as the axis of rotation Y5 but which is advantageously offset (by a distance d) in the direction Z with respect to the second connection 5. Thus, firstly, the third connection allows the rotation of the lever arm 10 to be converted into a translation of the electrode 61 in the direction X. The third connection needs therefore to transmit a translation in the direction X, while at the same time allowing the rotation of the lever arm about the direction Y. Secondly, it needs also to absorb a small translation in the direction Z: like the first connection 3, it needs to allow the rotation of the lever arm 10 to coexist with a translation. This third connection may be referred to as "coupling connection".

Figure 4A:
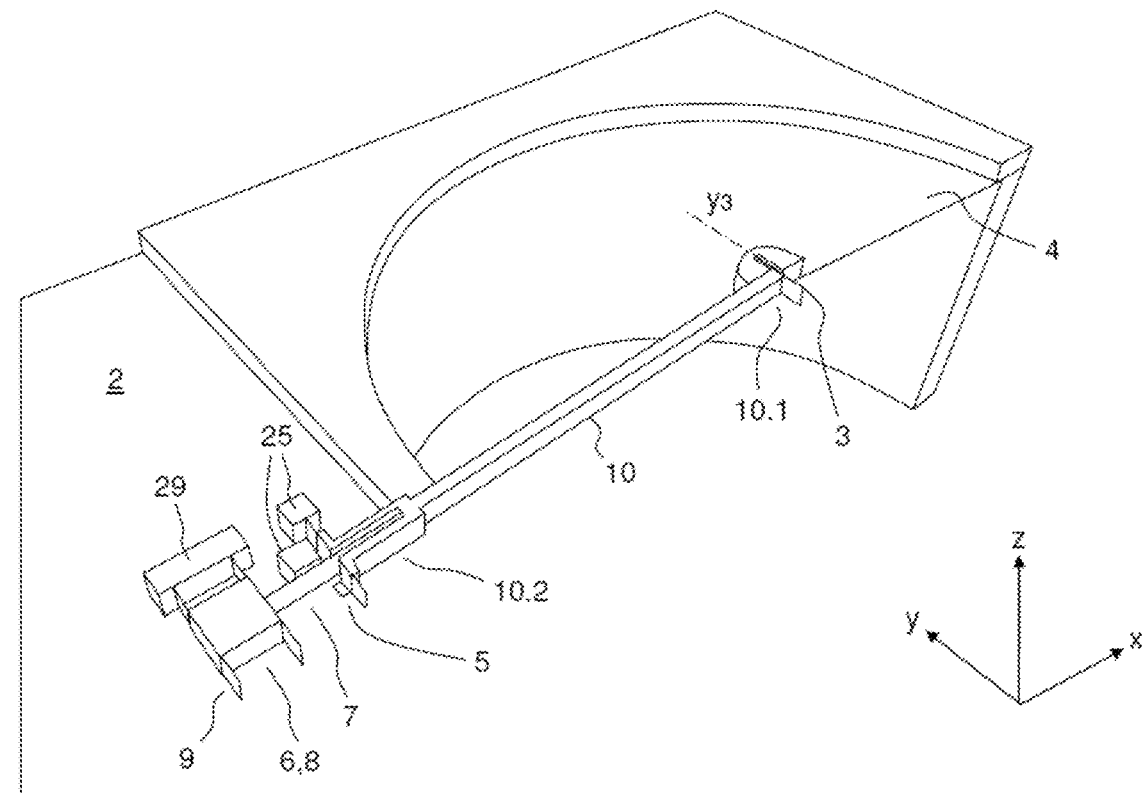
FIGS. 4A-4D depict various views of a device measuring variation in pressure (microphone, pressure sensor) according to a first embodiment.

The mobile electrode 61 is advantageously guided in translation in the direction X by a fourth connection 9 of the sliding connection type (depicted in FIG. 4A for example).

The difference between the two variants illustrated in FIGS. 3A and 3B is that the offset in the direction Z between the second and third connection is not in the same direction. In the variant in FIG. 3A, the second connection is above the third connection whereas, in the variant of FIG. 3B, the second connection is below the third connection. One or other configuration may thus be selected according to the design of the structure.

According to one embodiment variant, the third connection 7 may connect the second end 10.2 of the lever arm 10 to a transmission component 8 that it drives in translation in the plane, which transmission component in turn transmits a translation to a mobile electrode 61 (or to a strain gauge, to a resonant beam, or to any other means that allows translational motion in the plane to be detected).

FIGS. 4A to 4D depict various views of a MEMS-NEMS device for measuring variation in pressure according to a first embodiment. It might be a microphone or an absolute-pressure or differential-pressure sensor. For better legibility, certain parts, such as the anchoring blocks for example, are depicted in only half a plane. Furthermore, the grey arrows indicate the directions of coupling of the connections and the white arrows indicate the flexible directions of the connections.

In FIGS. 4A to 4D, the motion detection means 6 (for example capacitive detection means) are not depicted in detail but indicated schematically by a detection block. Even though only a certain one (or plurality) of the elements make up the detection block is mobile, namely deformable or able to be moved, it will be stated for the sake of simplification that the translational motion is transmitted to the detection block: that must therefore be understood as meaning that the translational motion is transmitted only to the mobile element or elements of the detection block.

The translational motion can be transmitted to the mobile element or elements directly or indirectly via a transmission component 8. In the latter case, it may be considered by convention that the transmission component 8 forms part of the detection block 6 and the third coupling connection 7 connects the lever arm 10 to the transmission component 8, which transmission component transmits the translation in the plane to the mobile element or elements of the detection block.

A mobile element of the detection means may be an electrode able to move (capacitive detection), a strain gauge that deforms (piezoelectric or piezoresistive detection), a resonant beam (detection through resonance) or any other mobile element allowing translational motion in the plane to be detected.

The device depicted comprises a diaphragm 4 made in the thin layer (NEMS) with, for example, a thickness of the order of 1 μm so that the diaphragm provides sealing while at the same time remaining flexible. In the case of a microphone, sealing is not compulsory.

Figure 4B:
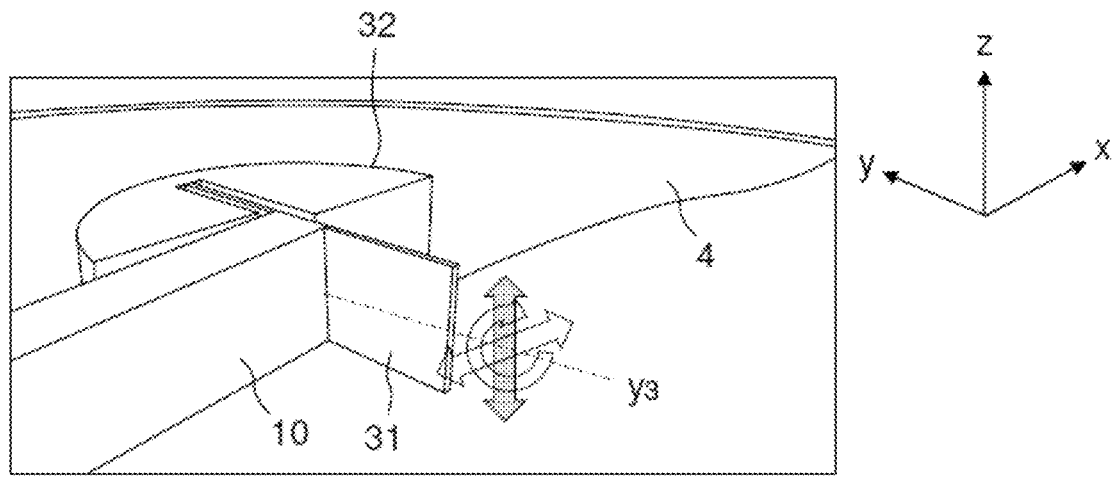

The movement of the centre of the diaphragm is transferred to a first end 10.1 of a lever arm 10 by a first connection 3 that can be seen in FIGS. 4A and 4B.

The first connection 3 is formed by at least one thick torsion blade 31 and by a fixing element 32 that fixes the thick blade 31 to the diaphragm. Because of the large thickness of this blade, the first connection has the advantage of strongly coupling out-of-plane translation (in the direction Z). Furthermore, the slenderness of the blade 31 in the direction X allows a torsion angle about a torsion axis Y3 in the direction Y and bending in the direction X. These two degrees of freedom of the thick blade 31 avoid the connection between the end 10.1 of the lever arm in rotation and the centre of the diaphragm 4 in translation becoming statically indeterminate.

The lever arm 10 is preferably etched into the thick layer (MEMS) in order to obtain sufficient stiffness.

The second end 10.2 of the lever arm is connected to a second connection 5 (pivot connection) at the base of the thick layer.

Figure 4C:
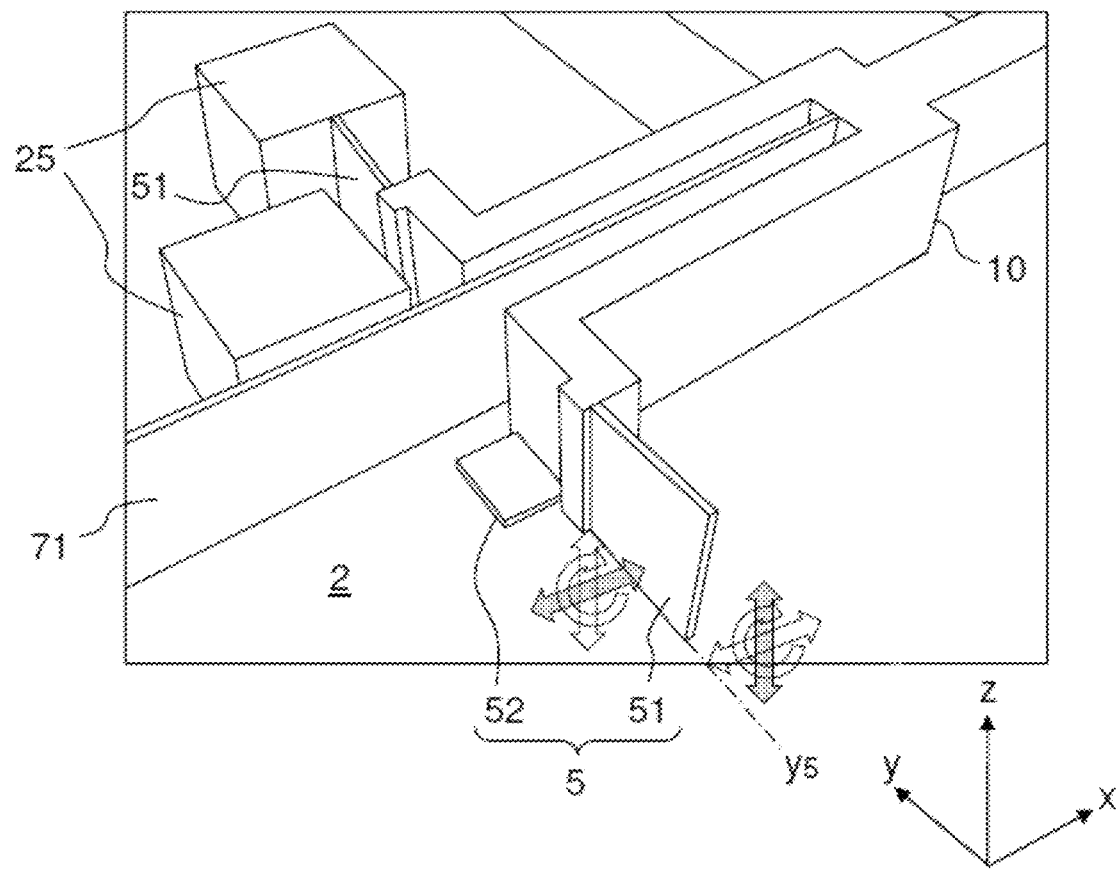

The second connection 5 is formed by two thick torsion blades 51 and two thin out-of-plane bending blades 52 (detail in FIG. 4C). Each blade is connected on the one hand to the lever arm 10 and on the other hand to the substrate 2 of the MEMS-NEMS structure, by an anchoring block 25. The substrate 2 extends in the plane OXY. The torsion blades 51, etched into the thick layer, block out-of-plane translation because of their high bending stiffness in Z and their anchorage, while at the same time offering low angular stiffness because of their short length in the direction X, allowing torsion about the direction Y. The out-of-plane bending blades 52, etched into the thin layer, block translation in the direction X because of their high compression stiffness and their anchorage, while at the same time offering low angular stiffness by virtue of their small thickness, allowing bending about the direction Y. The combination of the two thick torsion blades 51 and two thin bending blades 52 thus blocks out-of-plane and in-plane translations while at the same time allowing the lever arm 10 to rotate about an axis of rotation Y5 in the direction of rotation Y. The axis of rotation is thus defined at the base of the thick layer (MEMS) of the torsion blades 51, at the intersection of the core of the thin layer (NEMS) of the bending blades 52 and of the core of the torsion blades 51. The first pivot connection 5 thus allows the lever arm 10 to rotate about the axis of rotation Y5, and therefore allows an out-of-plane rotation with respect to the substrate 2.

The third connection 7 (coupling connection) designed to transmit the rotational motion of the lever arm 10 as a translational motion to the detection block 6 consists in a thick out-of-plane bending blade 71 connected on the one hand to the lever arm 10 and on the other hand to the detection block 6. The high compressive stiffness in the direction X of this blade which is thick and long in the direction X (detail in FIG. 4D) allows the movement in the direction X of the lever arm 10 at the middle of the blade to be transmitted to the detection means 6. A small out-of-plane bending about a bending axis Y7 parallel to the direction Y is enough to obtain a connection that is not statically indeterminate between the out-of-plane rotation of the lever arm 10 about the direction Y and the translation in the direction X of the detection block 6. In other words, even if the thick bending blade 71 has a large thickness, its rotation in bending about the out-of-plane direction Z which is permitted by its slenderness in the direction X and the small out-of-plane bending motion about the bending axis Y7 parallel to the direction Y allow the rotation of the lever arm 10 and the translation of the mobile element or elements of the detection block 6 to coexist.

Advantageously, the thick coupling blade 71 is centred about its bending axis Y7. Its deformation is therefore pure angular bending, as this is where it offers the least stiffness.

Because the bending axis Y7 of the third connection 7 appears in the middle of the MEMS thickness, the required eccentricity between the second connection and the third connection is indeed obtained. The thick out-of-plane bending blade that forms the coupling connection 7 can therefore be viewed as a link rod connected between the lever arm 10 and the detection block 6.

The detection block 6 is advantageously held in translation in the direction X by a fourth connection 9 (also referred to as sliding connection) able to guide translation in the plane.

Figure 4D:
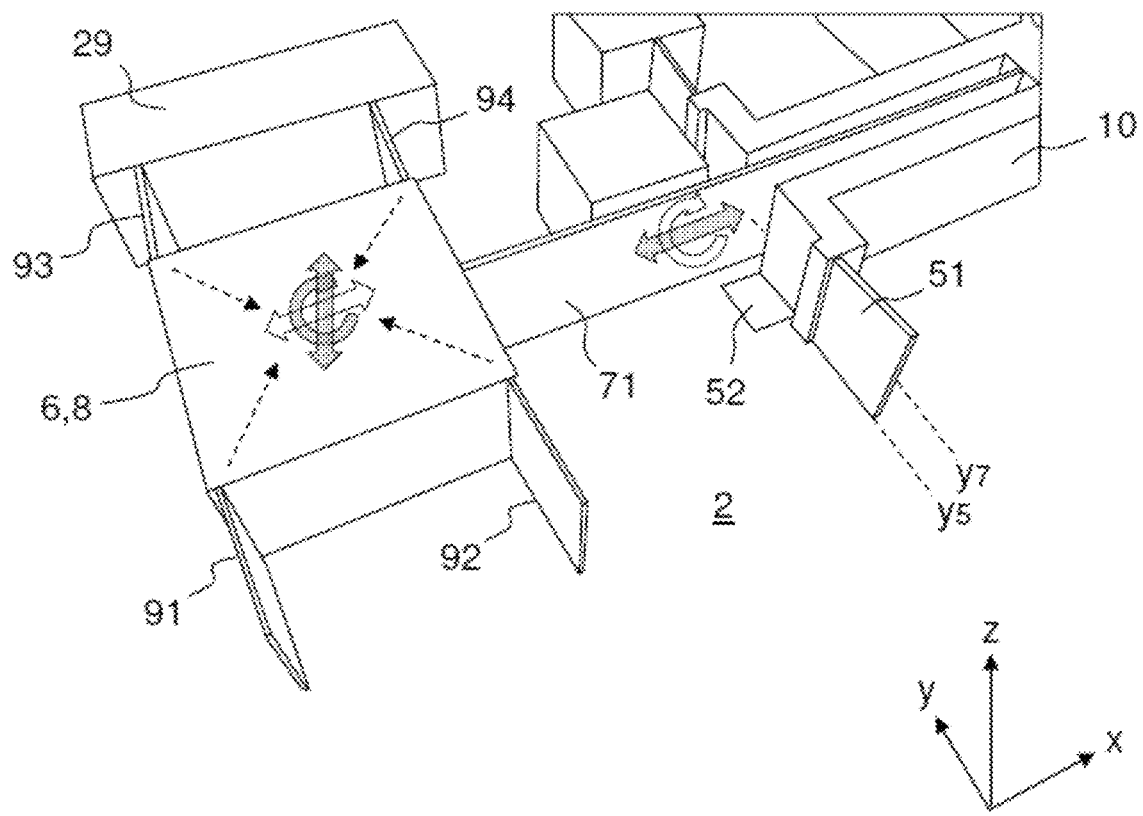

As depicted in greater detail in FIG. 4D, the sliding connection 9 comprises several thick in-plane bending blades 91, 92, 93, 94. These blades have high out-of-plane stiffness due to their great thickness. In addition, their high compressive stiffness in the direction Y allows translation in this direction Y to be blocked. Finally, their short length in the direction X generates a low bending stiffness in this direction X. That means that the translation transmitted to the detection block 6 can be guided in the direction X.

According to one advantageous embodiment, at least three thick bending blades 91, 92, 93 form the sliding connection 9, making it possible to block any rotation in the plane OXY. Alternatively, two thick blades that are sufficiently spaced apart in the direction X are enough to block rotation in the plane OXY. In the embodiment illustrated, there are four thick bending blades 91, 92, 93, 94, making it possible to improve the symmetry.

According to an embodiment variant, in which the detection block 6 comprises a transmission component 8 connected to the third connection 7, which transmission component in turn drives the translation of a mobile electrode, a strain gauge, a resonant beam or any other means for detecting translational motion in the plane, the sliding connection 9 is connected to the transmission component 8 in such a way as to guide same in translation in the plane.

Figure 5:
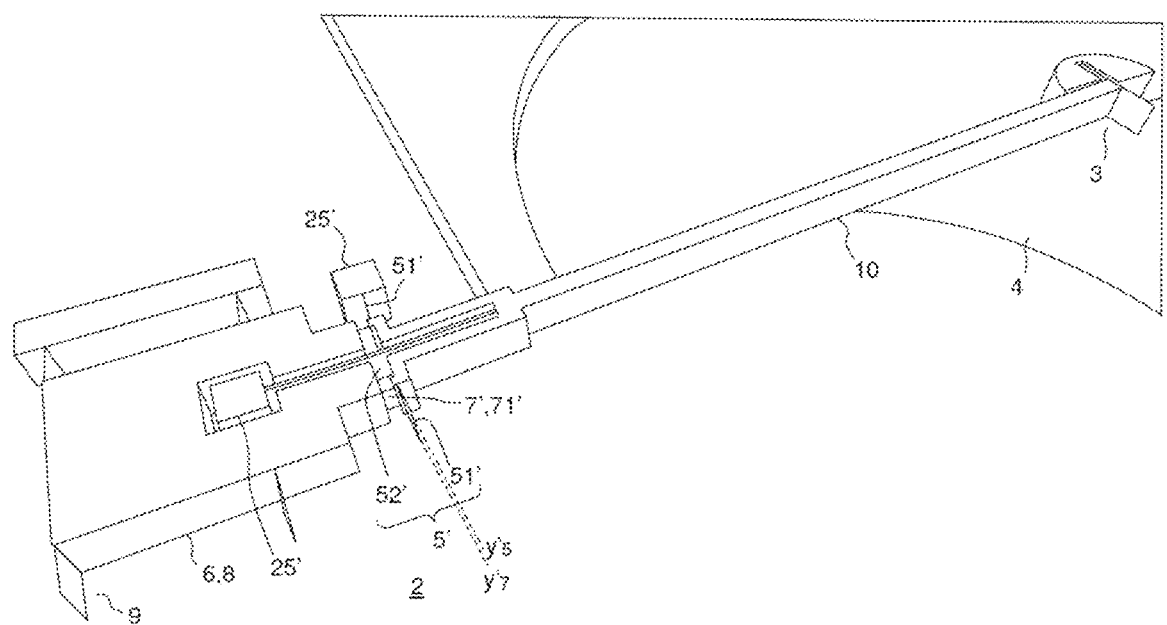
FIG. 5 depicts a variant of the device for measuring variation in pressure according to the first embodiment.

According to a variant of the first embodiment (embodiment of FIG. 3A, illustrated in FIG. 5), the second connection 5' or pivot connection may be formed by two thick torsion blades 51' of the type of those illustrated in FIGS. 4C and 4D (reference 51) and at least one thick out-of-plane bending blade 52' of the type of that illustrated in FIGS. 4C and 4D (reference 71). In that case, the thick out-of-plane bending blade is connected to the substrate 2 by an anchor block and not to the detection block 6 or to the transmission component 8. The thick out-of-plane bending blade is connected on the other hand to the lever arm 10. The axis of rotation Y5' of the lever arm is then in the middle of the thick layer MEMS (and no longer at the base of the thick layer, i.e. no longer at the core of the thin layer NEMS). Furthermore, the third connection or coupling connection 7' is then formed by the thin out-of-plane bending blades 71' of the type of those illustrated in FIGS. 4C and 4D (reference 52). These, rather than being connected to anchor blocks, are connected to the detection block 6 or to the transmission component 8. The bending axis Y7' is then no longer above the axis of rotation Y5' but below, at the core of the thin layer and not in the middle of the thick layer anymore.

Figure 6A:
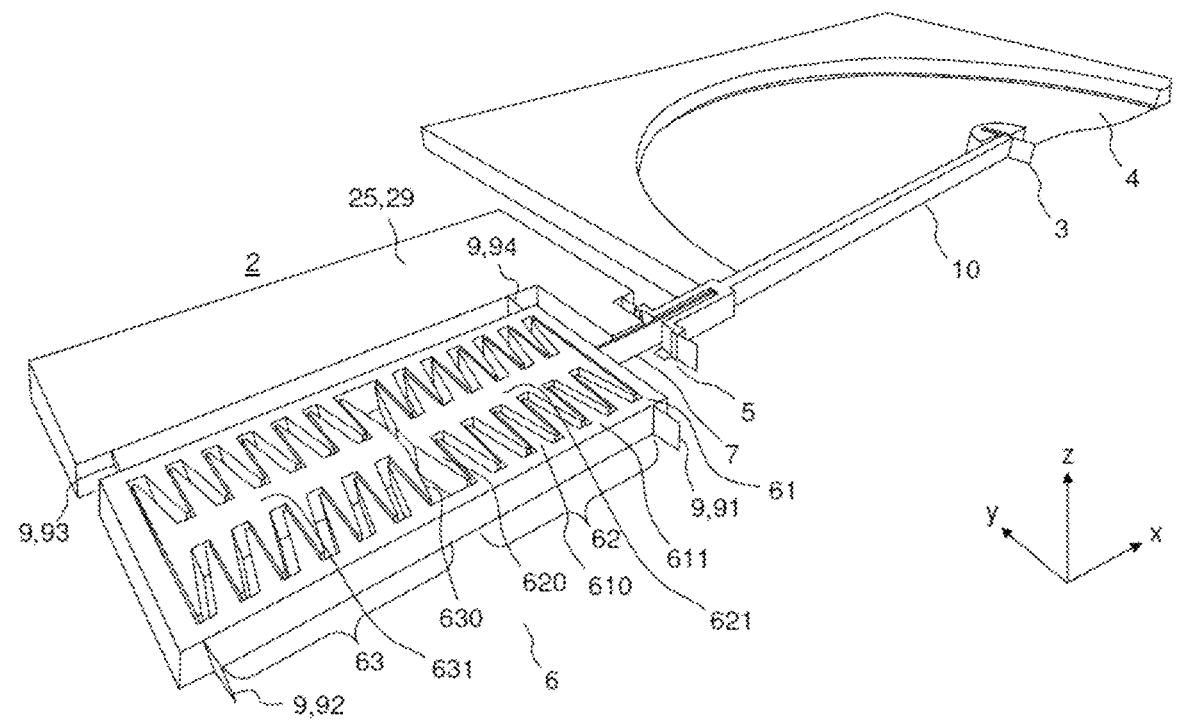
FIG. 6A depicts a device for measuring variation in pressure according to the first embodiment combined with a first, airgap variation capacitive transduction variant.
Figure 6B:
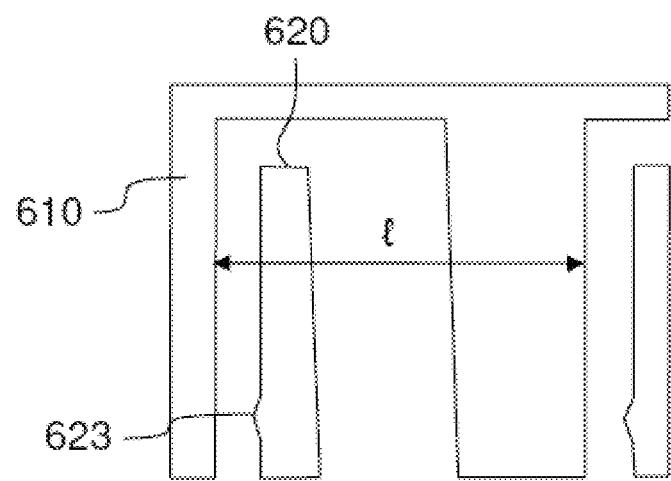
FIG. 6B depicts a detail of the first capacitive transduction variant.

FIGS. 6A and 6B depict a MEMS-NEMS device for measuring variation in pressure according to the first embodiment, combined with a first variant of a detection block 6 forming capacitive transduction with a variation in airgap. Such a detection block may be implemented for a MEMS-NEMS device for measuring variation in pressure according to the invention, notably, although not solely, for a MEMS-NEMS device for measuring variation in pressure according to one of the embodiments. The device comprises a diaphragm 4 connected to a lever arm 10 by a first connection 3, a second connection 5 allowing out-of-plane rotation of the lever arm 10 and a third connection 7 able to convert the out-of-plane rotation of the lever arm into an in-plane translational motion applied to a mobile electrode 61.

The capacitive detection block 6 depicted thus comprises a mobile electrode 61 which is driven in translation in the plane (in a direction X) by virtue of the coupling connection 7 and two fixed electrodes 62, 63. Each electrode 61, 62, 63 is formed by a series of fingers 610, 620, 630 forming a comb. The fingers 610 of the mobile electrode 61 are connected to one another by a stiffening frame or beam 611. The fingers 620, 630 of the fixed electrodes 62, 63 are connected to one another by a stiffening central beam 621, 631. The comb of a fixed electrode is interdigitated with the comb of the mobile electrode (and vice versa).

The electrodes are produced in the thick layer (MEMS).

Advantageously, as illustrated in FIG. 6B, at least one finger of the fixed electrode 62 comprises an end stop 623 extending towards the finger of the mobile electrode which is situated facing it in the same airgap, so as to prevent the surfaces of the two fingers from sticking together when they come into contact (namely as the size of the airgap tends towards zero). The end stop may be replaced by any other means that performs the same function and/or it may be arranged on at least one finger of the mobile electrode.

The mobile electrode 61 is kept in translation in the plane by virtue of simple thick in-plane bending blades 91, 92, 93, 94 that form a sliding connection 9. These blades have high out-of-plane stiffness, on account of their large thickness. In addition, their high compressive stiffness in the direction Y allows translation in this direction Y to be blocked. Finally, their short length in the direction X generates low stiffness in this direction X. That allows the translation of the mobile electrode 61 in the direction X to be guided.

According to an embodiment variant, a sliding connection may comprise double blades rather than single blades. A double blade comprises two simple in-plane bending blades that meet to form a U, each blade being elongate in the direction Y and slender in the direction X, a first blade being connected to the mobile electrode and a second blade being connected to the fixed support, or substrate, the two blades being joined together by an intermediate connecting piece. This configuration allows for a far more linear stiffness as the electrode moves in the desired direction X, notably in the event of large movements, even though it provides less stiffness in the direction Y.

Unlike the capacitive transduction of the prior art, which is notably illustrated in FIG. 1B, in which the electrode has a vertical motion (out-of-plane motion), the capacitive transduction rendered possible by the invention is achieved by a horizontal motion (in-plane motion) of the mobile electrode.

The invention is thus able to address the problems presented by capacitive-detection microphones (or pressure sensors) of the prior art, and which are explained in greater detail in connection with FIGS. 1B and 2, as explained in what follows.

On the one hand, according to the invention, the airgap is not limited by the thickness of the sacrificial layers but is defined by an in-plane dimension in addition to the thickness. Now, this in-plane dimension is not limited like the thickness is, and it is possible to define a specific dimension for the fingers of the mobile electrode and/or of the fixed electrode notably in order to define a given airgap, and to do so by designing specific masks. Thus, for example, an airgap measuring from a few hundred nanometres to a few microns can be obtained by etching of the thick layer (MEMS). At the present time, the prior art allows the aspect ratio between the airgap and the thickness of the layer to achieve only values from 1/20 to 1/30.

On the other hand, the beams are loaded mainly in compression or in tension (in-plane) rather than in bending (out-of-plane) and are therefore loaded where they are intrinsically stiffer. That makes it possible to reduce the mass of the stiffening beams and therefore the overall mass of the electrodes, for the same deformation, but also to design electrodes that are larger than those of the prior art, the latter being limited by the out-of-plane deformations and stiffness.

The beams can also be enlarged at the most heavily loaded points and, on the other hand, made more slender where loadings are lower. This is notably what is done at the capacitive fingers, which are designed in the shape of a triangle. By improving the stiffness to size ratio, this ploy makes it possible to increase the density of the fingers and minimize their mass. Limiting the mass of the mobile electrodes makes it possible to increase the resonant frequency. This factor is important for microphones that need to measure signals up to 20 kHz. It is more especially true of ultrasound microphones.

In the embodiment illustrated in FIG. 6A, detection is differential. There are in fact two fixed electrodes: a first fixed electrode 62 which is depicted on the right-hand part of the capacitive detection block 6 and for which the fingers 620 are positioned to the left of the fingers 610 of the mobile electrode 61, and a second fixed electrode 63 which is depicted in the left-hand part of the capacitive detection block 6 and for which the fingers 630 are positioned to the right of the fingers 610 of the mobile electrode 61. Thus, when the mobile electrode moves to the right, that increases the airgap to the first fixed electrode and that decreases the airgap to the second fixed electrode, and vice versa. Differential detection improves the reading of the capacitances. It affords another advantage, which is that of equalizing the electrostatic forces. Specifically, the fingers mutually attract. In this instance, the fixed electrode on the left attracts the mobile electrode toward the left, and the fixed electrode on the right attracts the mobile electrode towards the right. These two forces oppose one another and cancel one another through compressive stresses in the frame of the mobile electrode.

Alternatively, there could be just one single fixed electrode.

Another advantage of the invention is that differential detection is easier to perform in the plane, with specific designs of masks, whereas in the differential detections of the prior art, illustrated notably in FIG. 1B, it was necessary to provide two sacrificial layers, generally of the same thickness.

Finally, the invention, by making it possible to generate in-plane motion of the mobile electrode 61, makes it possible to increase the capacitive density. FIG. 6B illustrates this advantage by zooming in on a finger of a fixed electrode between two fingers of the mobile electrode. It may be seen for example that it is possible to create individual patterns of length l equal to 8 µm. Furthermore, the electrodes are in the thick layer (MEMS) and can attain a thickness of 20 µm. In this example, the facing surface area is therefore 2.5 times larger than the surface area occupied, whereas in out-of-plane detection the facing surface area corresponds only to the occupied surface area.

Figure 7A:
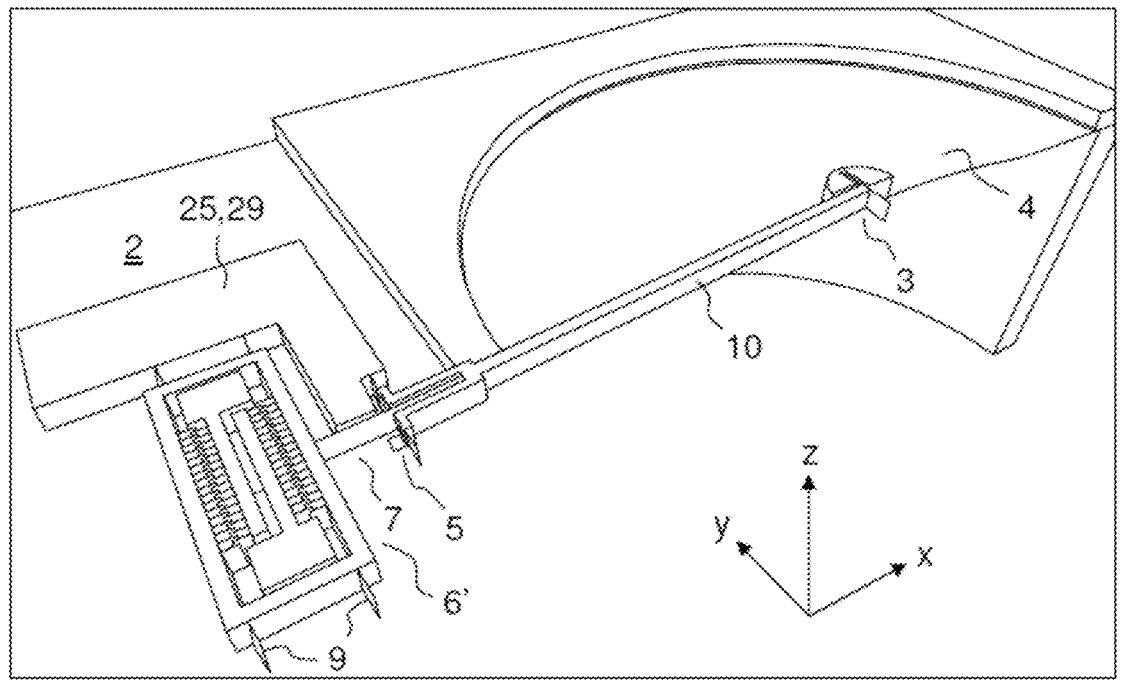
FIGS. 7A-7B depict a device for measuring variation in pressure according to the first embodiment combined with a second, surface area variation capacitive transduction variant.
Figure 7B:
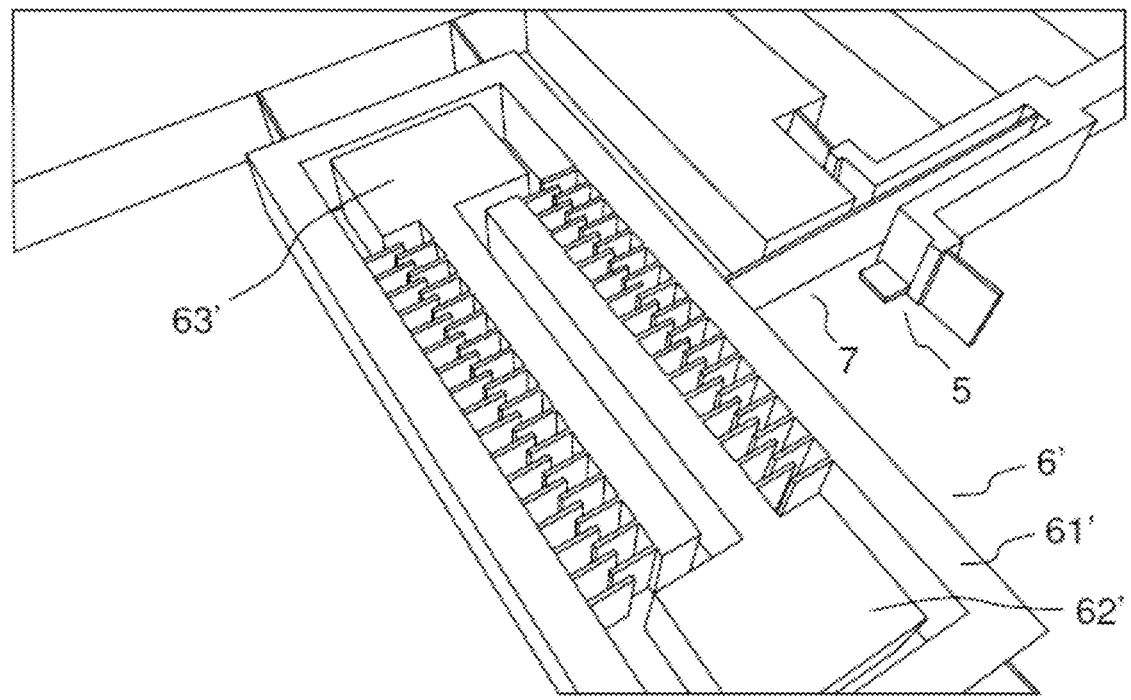

FIGS. 7A and 7B illustrate second variant of in-plane capacitive transduction block, in which variant the capacitive transduction block 6' is configured differently. In this variant, there is also one mobile electrode 61' and two fixed electrodes 62' and 63' but this variant differs from the first in that the fingers of the electrodes extend in the direction of translation transmitted to the mobile electrode 61' (whereas in the first variant, the fingers extend in the plane in the direction perpendicular to the direction of the translation transmitted to the mobile electrode 61). This then allows capacitive detection to be achieved through variation in surface area.

Detection by variation in airgap is well suited to small movements because it provides a greater variation in capacitance for a given movement. However, for large movements, it becomes nonlinear and detection by variation in surface area according to this second embodiment is then more suitable. Furthermore, when the electrode is not placed in a vacuum, the variation in airgap will be accompanied by an effect known as "squeeze film damping" which corresponds to the squeezing of the film of air between two electrodes. This phenomenon leads to a damping effect, and therefore to noise. A variation in surface area creates less mechanical noise. Finally, the nonlinear effect of the variation in airgap, firstly, can be used to obtain a negative stiffness dependent on the bias voltage, and thus to regulate the resonant frequency of the device.

Both variants of capacitive-detection block can be implemented in a MEMS-NEMS device for measuring variation in pressure according to the invention, in particular, but not only, in a MEMS-NEMS device for measuring variation in pressure according to one of the embodiments.

Figure 8A:
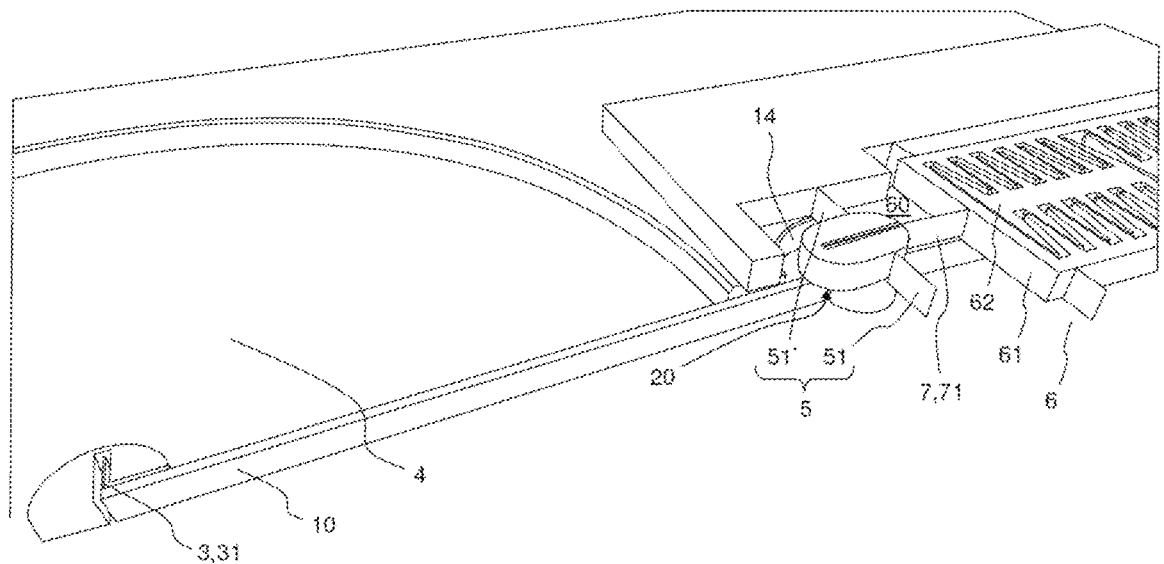
FIG. 8A depicts a device for measuring variation in pressure according to a second embodiment.
Figure 8B:
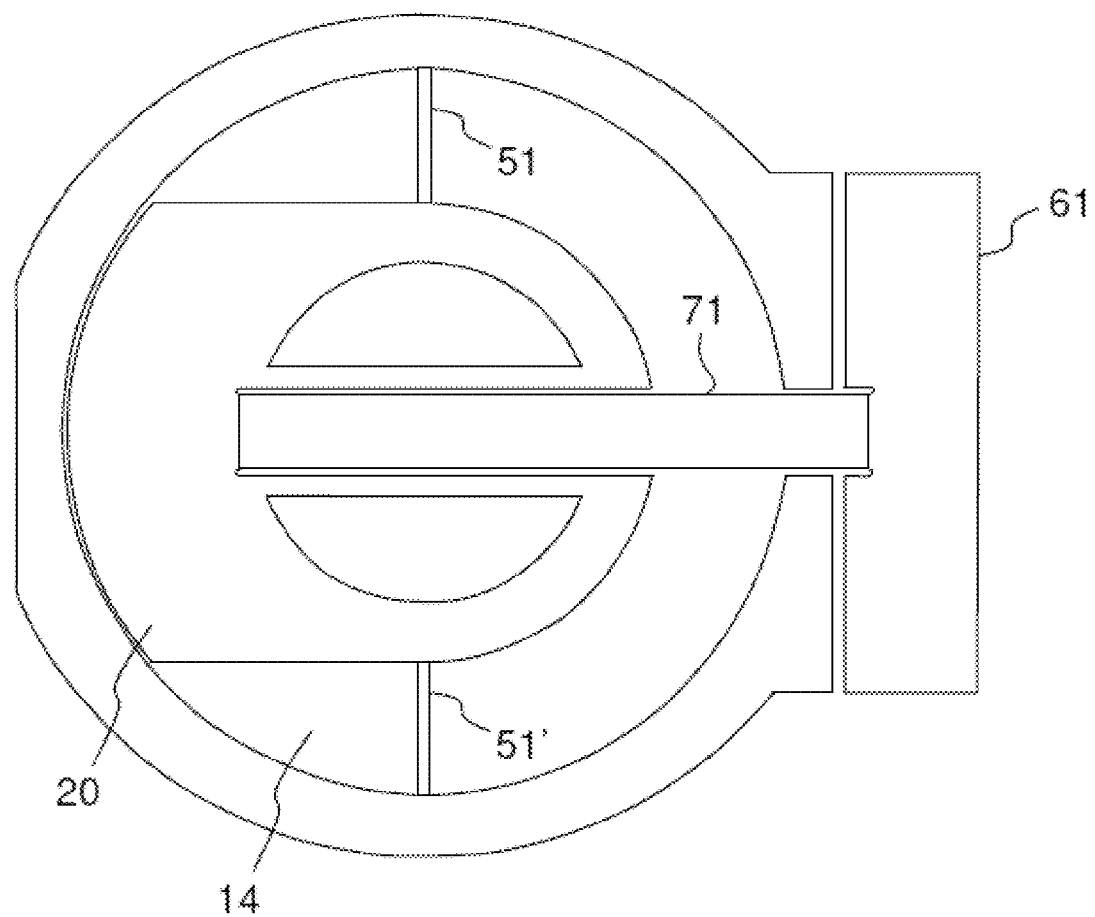
FIG. 8B depicts a detail of the device for measuring variation in pressure according to the second embodiment.

FIGS. 8A and 8B depict a device for measuring variation in pressure according to a second embodiment which differs from the first embodiment in that the electric transduction is performed in a reduced-pressure, or even under vacuum, measurement cavity 60, like in the MEMS-NEMS device for measuring variation in pressure that is described in Patent Application FR3059659. The pivot articulation in the patent application, depicted in FIG. 1A, that provides out-of-plane rotation articulation of the transmission element 20 is achieved by thick torsion blades 22.1 and 22.2 (which block out-of-plane translations) and the sealing membrane 16 (which blocks in-plane movements). In Patent Application FR3059659, the transmission element 20 is rigid or largely nondeformable. The motion transmitted by the transmission element, and in particular by the second transmission arm 20.2 to the mobile electrode 21 in the measurement chamber is an out-of-plane motion.

The invention allows the out-of-plane motion to be converted into an in-plane translation by replacing the second rigid transmission arm by a third connection 7 and notably a thick out-of-plane bending blade 71 forming the third connection 7 of the mechanical connection according to the invention.

Thus, in the second embodiment with reference to FIG. 8A (view from beneath), the mechanical connection according to the invention comprises:
a lever arm 10;
a first connection 3 formed by at least one torsion blade 31 which connects the diaphragm 4 to the lever arm 10;
a second connection 5 formed by the two thick torsion blades 51 and 51' and by the sealing membrane 16;
a third connection 7 formed by a thick out-of-plane bending blade 71 which allows a translation to be transmitted to a mobile electrode 61 positioned in the reduced-pressure measurement cavity 60.

Furthermore, the device for measuring variation in pressure comprises a sealing member 14 connected to an element 20 providing mechanical transmission between the external environment and the measurement cavity 60, all of this creating sealing between the external environment and the measurement cavity. The transmission element 20 connects the two mediums in a sealed manner while at the same time providing the mechanical connection between the lever arm 10 and the third connection 7. In that it is connected to the second connection 5.

In this second embodiment, use is made of two thick layers MEMS (one thick layer in the reduced-pressure cavity and one layer in the air). The thick torsion blades 51 and 51' are placed in the reduced-pressure cavity but could be implemented in any layer, or even each in a different layer.

The third connection 7, which in this instance is the thick blade 71, is placed in the reduced-pressure measurement cavity.

The thick blade 71 is connected to a mobile electrode 61 which is thus given a translational motion in the plane in the reduced-pressure cavity. The capacitor 6 depicted is that of the first variant of FIGS. 6A and 6B. Alternatively, it could be that of the second variant of FIGS. 7A and 7B, or any other suitable capacitor.

As an alternative to capacitive transduction, the detection block 6 may comprise a resonant beam, so as to perform detection using resonance. This alternative applies to all the embodiments, and more broadly to any MEMS-NEMS device for measuring the variation in pressure according to the invention. However, it is advantageous to perform detection by resonance in a cavity at a reduced pressure, namely for example according to the second or third embodiment described later. This is because in order to obtain a good Q factor, the viscous damping of a resonator needs to be reduced by siting it in a rarefied atmosphere.

The detection block may then comprise a resonant beam advantageously placed in a reduced-pressure cavity, the motion of the diaphragm or of the piston being converted by virtue of the mechanical connection of the invention into an in-plane translational motion which is transmitted to the resonant beam which can thus be compressed or tensioned in the plane. The stress induced by the compression or tension in the beam shifts the resonant modes of the beam. By energizing the beam laterally, for example using an electrostatic force, and by measuring its deformation in this lateral direction, for example using piezoresistive gauges on the sides of the resonant beam, it is possible to find and then monitor the resonant modes of the beam. By measuring, for example, the frequency of the first deformation mode, it is possible to acquire a picture of the movement of the resonant beam and from that work back to the motion of the diaphragm and of the piston, and thus acquire a value for the variation in pressure.

As the lever arm is in rotation, the movement of the elements connected thereto is proportional to their distance from the centre of rotation of the lever arm. In the cases described hereinabove (FIGS. 3A to 8B), the length L of the lever arm is greater than the radius of the diaphragm in order to pick up the motion (a few hundreds of microns) at its centre, and the eccentricity d between the second and third connections is equal to half of the MEMS thickness (around 10 microns). As a result, the movement of the electrode will be more than one order of magnitude smaller than the movement of the diaphragm.

The diaphragm 4 may advantageously be replaced by a piston 4'. A piston may be outlined and stiffened and may have any shape. A parallelepipedal piston connected to the lever arm at its centre makes it possible to mechanically reduce the size of the lever arm if the length of the piston in the longitudinal direction of the lever arm (direction X in the figures) is reduced while at the same time increasing the width of the piston in the transverse direction of the lever arm (direction Y in the figures), this being done in the same proportions, in order to maintain the same piston surface area.

Alternatively, use may be made of several lever arms distributed around the diaphragm or around the piston and the arms may be connected (using the same number of first connections) not now to the centre of the diaphragm or the piston, but to one of the ends thereof. Preferably, the lever arms are uniformly distributed around the diaphragm or around the piston.

Figure 9A:
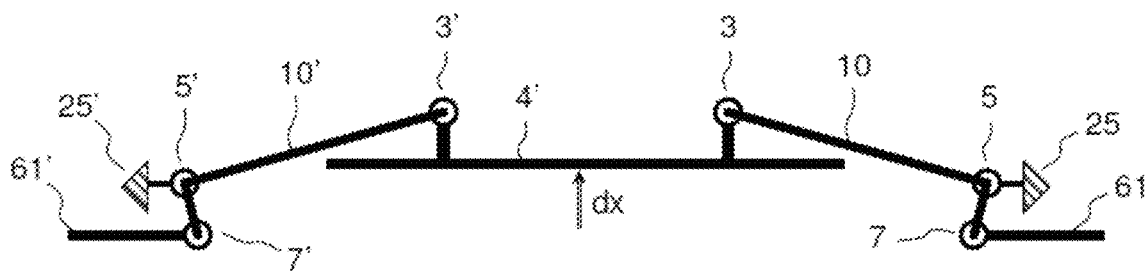
FIGS. 9A-9C schematically depict three other variants of mechanical connections according to the invention.
Figure 9B:
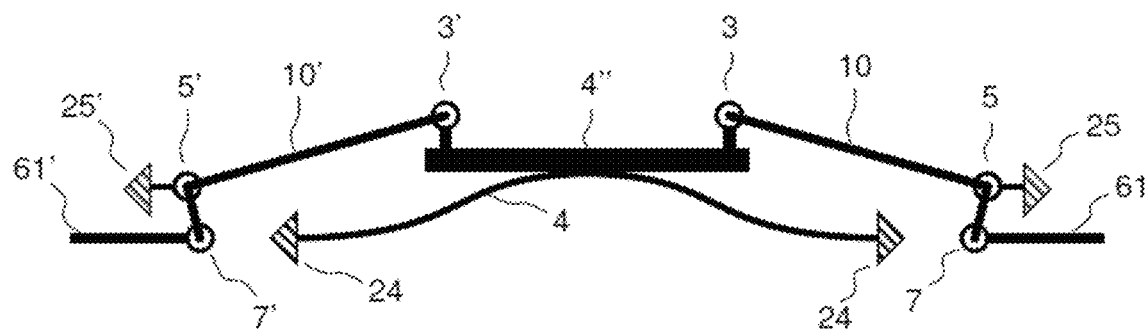
Figure 9C:
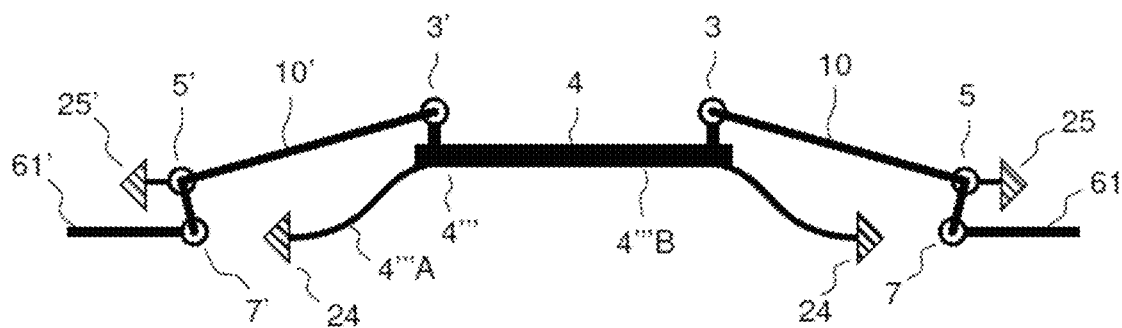

FIGS. 9A, 9B and 9C depict three embodiment variants of the solution involving two lever arms.

FIG. 9A depicts a rigid piston 4' connected to two lever arms 10, 10' at each of its ends. The piston typically consists of a framework of thick beams in the MEMS layer in order to be rigid, covered with a thin NEMS diaphragm over the entire surface area formed by the framework, so as to be lightweight. In this embodiment variant, two first connections 3, 3' connect the first ends of two lever arms 10, 10' to the MEMS framework at the edge of the piston.

FIG. 9B depicts a flexible diaphragm 4 connected at its middle, as in FIGS. 3A to 8B. The difference is that the flexible diaphragm 4 is connected to two first connections 3, 3' via a rigid beam 4", this being to the two ends of the rigid beam. The rigid beam 4" is a thick beam of the MEMS layer, and its function is to transmit the translation from the centre of the diaphragm to the lever arms.

FIG. 9C depicts a diaphragm 4' comprising a flexible part 4'''A and a rigid part 4'''B connected to two lever arms 10, 10' at each of its ends via two first connections 3, 3'.

These three variants entail the creation of two first connections 3, 3', two second connections 5, 5' and two third connections 7, 7'. Furthermore, the detection means 6 need to comprise two mobile elements 61, 61'. That amounts to using several mechanical connections according to the invention. These three embodiment variants may be obtained by using the thin layer and/or the thick layer in order to produce the various components.

In the three variants, the lever arms have been shortened because they no longer need to connect to the centre of the diaphragm.

The lever arms are advantageously uniformly distributed in order to prevent the rigid piston from twisting under the effect of a resultant moment.

Figure 10A:
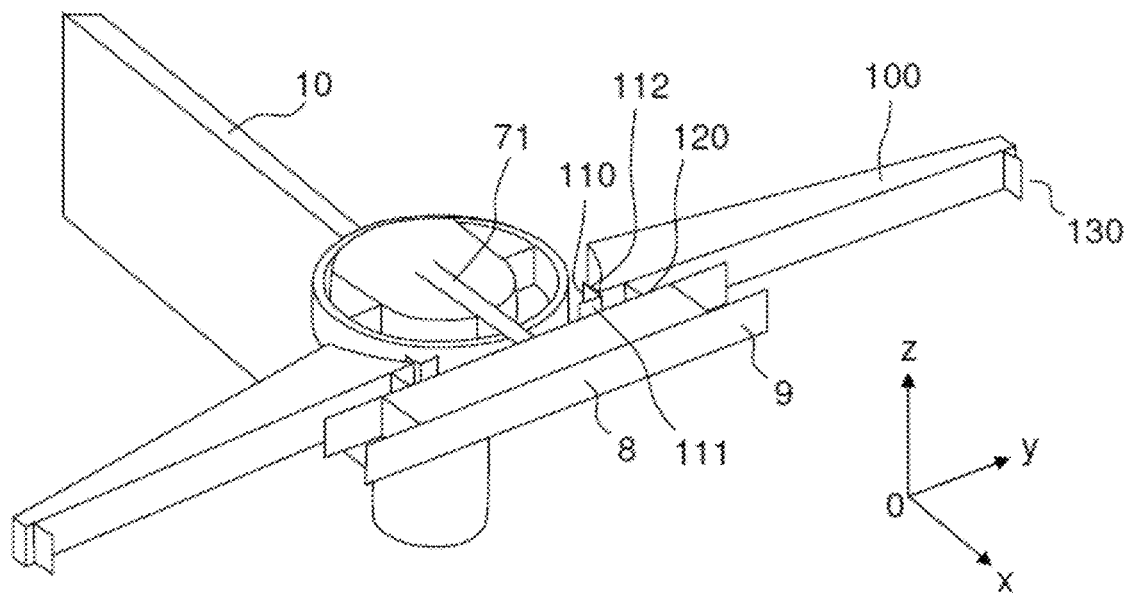
FIGS. 10A-10B depict a device for measuring variation in pressure according to a third embodiment.
Figure 10B:
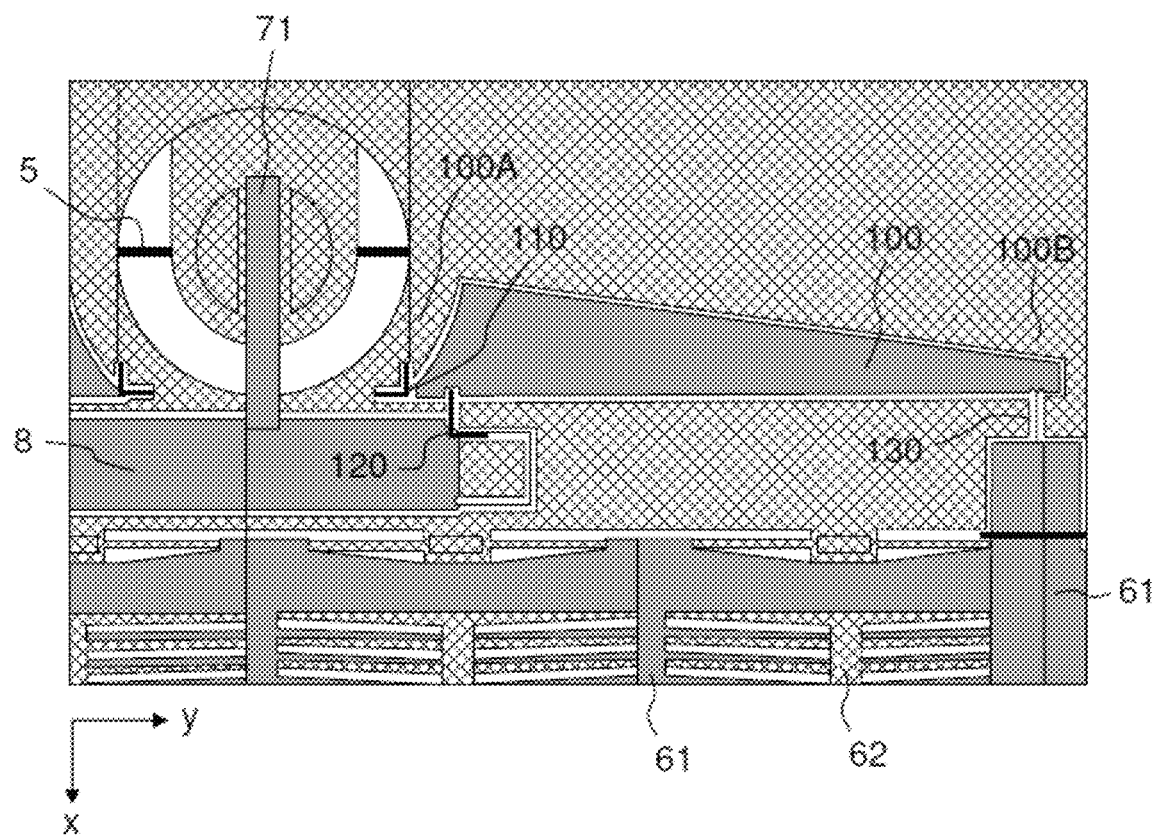

FIGS. 10A and 10B depict a third embodiment that allows the horizontal movement to be increased. In this third embodiment, as in the second embodiment, electric transduction is performed in a reduced-pressure, or even evacuated, cavity. Alternatively, transduction could be not performed in such a cavity, as in the first embodiment. Further, an additional lever arm 100 placed after the lever arm 10 provides an increase in movement which compensates for the loss of gain of the lever arm. As previously, the mechanical connection transmits motion in X to the transmission component 8 via an out-of-plane bending blade 71. This transmission component 8 drives an additional lever arm 100 in rotation in the plane OXY via a first coupling blade 120, the additional lever arm being held in rotation by a hinge 110. The first coupling blade and the hinge are positioned at a first end 100A of the lever arm. The hinge 100 is produced by two mutually perpendicular thick blades 111 and 112 of which the intersection defines the axis of rotation in the direction Z. The first coupling blade 120 is thick in the direction Z, extends in the direction X, and is slender in the direction Y. The first coupling blade 120 therefore transmits the movement in the direction X by virtue of its high compression stiffness while at the same time, by virtue of its low bending stiffness, allowing the translation of the transmission component 8 and the rotation of the additional lever arm 100 to coexist. On the same principle, a second coupling blade 130 transmits the motion in X of the other end 100B of the additional lever arm 100 to a mobile electrode 61 held in translation in X. The additional lever arm therefore multiplies the movement by the ratio of the distance between the hinge 110 and the second coupling blade 130 to the distance between the hinge 110 and the first coupling blade 120.

In all of the embodiments described "thin" should be understood as meaning of the order of around 100 nanometres (nm) and less than a few micrometres (μm) (NEMS) and "thick" should be understood as meaning between a few μm and a few tens of μm (MEMS).

Preferably, the thickness of a thin layer is comprised between 200 nm and 2 μm.

Preferably, the thickness of a thick layer is comprised between 5 and 30 μm, or even between 10 and 20 μm.

Unless indicated to the contrary, the various embodiments set out can be combined with one another. Further, the present invention is not restricted to the embodiments described hereinabove but extends to any embodiment that falls within the scope of the claims.

The mechanical connection and the microelectromechanical structure and/or nanoelectromechanical structure of the invention can be manufactured using the known micromachining (and/or nanomachining) technologies for accelerometers, on silicon. In order to create such a mechanical connection and such a microelectromechanical and nanoelectromechanical structure, it is possible to implement the following general method: the starting point is a silicon on insulator (SOI) comprising at least one layer of substrate made of Si, on which is placed a first layer of silicon oxide (SiO2) measuring a few hundred nanometres to a few microns and acting as a first sacrificial layer upon freeing of the mobile components, and placed onto the first layer of SiO2 is a thin layer of monocrystalline silicon (NEMS) measuring a few hundred nanometres to a few microns and used for creating the strain gauges and the thin blades;

the patterns of the NEMS layer are produced using photolithography and etching in order to outline the strain gauges and the thin blades;

a second sacrificial layer of silicon oxide, likewise measuring from a few hundred nanometres to a few microns, is then deposited. This second layer of SiO2 is etched so that it remains only at certain points where it will act as an arresting layer during the deep etching of the thick layer (MEMS) in the next step. Thus, the MEMS layer can be protected. The second layer of oxide is destroyed during the final freeing step;

next, a step of epitaxial growth of silicon is carried out, yielding the thick layer (MEMS, measuring from a few microns to a few tens of microns). This layer is shaped by deep photolithography and deep etching (Deep Reactive Ion Etching);

finally, the mobile components are freed by virtue of the partial etching of the sacrificial layers of silicon oxide. The wafer may notably be exposed to hydrofluoric acid, advantageously in the vapour phase, for a controlled duration.

The mechanical connection according to the invention is therefore particularly well suited to the creation of a device for measuring variation in pressure, for example for creating a microphone or a pressure sensor. A diaphragm or piston, in contact with the external environment, picks up the variations in acoustic pressure and the detection means, which are advantageously capacitive, measure these variations in pressure.

The detection means may comprise a capacitor, a resonant beam, or piezoresistive or piezoelectric means in the form of strain gauges or else a combination of the means. Advantageously, they may comprise at least two capacitors, two strain gauges or two resonators so as to perform a differential measurement.

The invention claimed is:

1. A mechanical connection for a microelectromechanical and/or nanoelectromechanical device for measuring a variation in pressure, the device comprising a fixed component extending in a main plane (OXY), a mobile component able to move or to deform in an out-of-plane direction under the effect of a variation in pressure, and detection means for detecting movement or deformation comprising at least one mobile element, the mechanical connection comprising:
   a lever arm;
   a first connection connecting the mobile component to a first end of the lever arm, the first connection being designed to transmit the out-of-plane movement of the mobile component to the first end of the lever arm while allowing the out-of-plane rotation of the lever arm about a direction of rotation;
   a second connection connected to the second end of the lever arm and fixed to the fixed component to allow mainly an out-of-plane rotation of the lever arm about an axis of rotation extending in the direction of rotation;
   a third connection connecting the lever arm to the detection means at a given distance from the axis of rotation in the out-of-plane direction, the third connection being designed to allow a rotation about an axis of bending which follows the same direction as the axis of rotation but which is offset by the distance in the out-of-plane direction from the axis of rotation, so as to convert the rotation of the lever arm about the axis of rotation into a translation in the plane (OXY) of the at least one mobile element in a direction of translation.

2. The mechanical connection according to claim 1, wherein the detection means comprise a transmission component connected to the at least one mobile element of the detection means, the third connection being connected to the transmission component in such a way as to transmit the translation in the direction of translation to the mobile element via the transmission component.

3. The mechanical connection according to claim 1, further comprising a fourth connection of the sliding-connection type, connected to the at least one mobile element or to the transmission component and configured to guide the mobile element or the transmission component in translation in the direction of translation.

4. The mechanical connection according to claim 3, wherein the fourth connection comprises at least a simple thick bending blade bending in the plane (OXY), the blade being slender in the direction of translation.

5. The mechanical connection according to claim 3, wherein the fourth connection comprises at least a double thick bending blade bending in the plane (OXY), each blade being slender in the direction of translation.

6. The mechanical connection according to claim 1, wherein the first connection comprises at least one thick torsion blade twisting out-of-plane about a torsion axis parallel to the direction of rotation.

7. The mechanical connection according to claim 1, wherein the second connection comprises at least a first thick torsion blade twisting out-of-plane about the direction of rotation and/or at least a second bending blade bending out-of-plane about the direction of rotation, each of the first and/or second blades being connected on the one hand to the lever arm and on the other hand to the fixed component, for example using at least one anchoring block.

8. The mechanical connection according to claim 1, wherein the third connection comprises a bending blade bending out-of-plane about a bending axis, the blade extending in the direction of translation and being either a thick blade or a thin blade, the bending axis being parallel to the axis of rotation and offset by the given distance with respect to the axis of rotation in the out-of-plane direction.

9. A device for measuring a variation in pressure comprising a fixed component extending in a main plane (OXY), a mobile component moving or deforming out-of-plane under the effect of a variation in pressure, and detection means for detecting the movement or the deformation and a mechanical connection according to claim 1, the mechanical connection being configured to connect the mobile component to at least one mobile element of the detection means.

10. The device for measuring a variation in pressure according to claim 9, wherein the mobile component is a flexible or semi-rigid diaphragm.

11. The device for measuring a variation in pressure according to claim 9, wherein the mobile component is a rigid piston.

12. The device for measuring a variation in pressure according to claim 9, comprising a reduced-pressure measurement chamber, a sealing membrane at least partially closing the measurement chamber and means of fluidtight connection between the inside and the outside of the measurement chamber, the first connection being positioned on the outside of the measurement chamber, the second connection being connected to the fluidtight-connection means, the detection means and the third connection being positioned in the measurement chamber.

13. The device for measuring a variation in pressure according to claim 12, wherein the detection means comprise two fixed electrodes so as to perform differential detection.

14. The device for measuring a variation in pressure according to claim 9, wherein the detection means comprise a mobile electrode connected to the third connection or to the transmission component and at least one fixed electrode, the electrodes extending in the main plane (OXY) and the airgap between the mobile electrode and the at least one fixed electrode being defined by a dimension of the electrodes in the main plane and by the thickness of the electrodes, the translational motion transmitted by the third connection to the mobile electrode being able to cause the airgap between the mobile electrode and the at least one fixed electrode to vary in the direction of translation.

15. The device for measuring a variation in pressure according to claim 14, wherein the electrodes comprise several fingers, the fingers of the mobile electrode being interdigitated with the fingers of the at least one fixed electrode and in that the fingers of the electrodes extend perpendicular to the direction of the translation transmitted to the mobile electrode.

16. The device for measuring a variation in pressure according to claim 9, wherein the detection means comprise a mobile electrode connected to the third connection or to the transmission component and at least one fixed electrode, the electrodes extending in the main plane (OXY) and the mutually-facing surface-areas of the mobile electrode and of the at least one fixed electrode being defined by a dimension of the electrodes in the main plane and by the thickness of the electrodes, the translational motion transmitted by the third connection to the mobile electrode being able to cause the mutually-facing surface areas of the mobile electrode and of the at least one fixed electrode to vary in the direction of translation.

17. The device for measuring a variation in pressure according to claim 16, wherein the electrodes comprise several fingers, the fingers of the mobile electrode being interdigitated with the fingers of the at least one fixed electrode and in that the fingers of the electrodes extend in the direction of the translation transmitted to the mobile electrode.

18. The device for measuring a variation in pressure according to claim 9, the detection means comprising a resonant beam, excitation means lateral to the beam and means for measuring the deformation of the beam in the lateral direction, for example piezoresistive gauges on either side of the resonant beam.

19. The device for measuring a variation in pressure according to claim 9, comprising at least two mechanical connections.

\* \* \* \* \*